US008751726B2

(12) United States Patent
Katz

(10) Patent No.: US 8,751,726 B2
(45) Date of Patent: Jun. 10, 2014

(54) SYSTEM AND METHODS EMPLOYING MOCK THRESHOLDS TO GENERATE ACTUAL READING THRESHOLDS IN FLASH MEMORY DEVICES

(75) Inventor: Michael Katz, Haifa (IL)

(73) Assignee: Densbits Technologies Ltd., Haifa (IL)

(*) Notice: Subject to any disclaimer, the term of this patent is extended or adjusted under 35 U.S.C. 154(b) by 1057 days.

(21) Appl. No.: 12/596,438

(22) PCT Filed: Sep. 17, 2008

(86) PCT No.: PCT/IL2008/001232
§ 371 (c)(1),
(2), (4) Date: Oct. 18, 2009

(87) PCT Pub. No.: WO2009/072102
PCT Pub. Date: Jun. 11, 2009

(65) Prior Publication Data
US 2010/0146191 A1   Jun. 10, 2010

Related U.S. Application Data

(60) Provisional application No. 60/996,782, filed on Dec. 5, 2007, provisional application No. 61/006,805, filed on Jan. 31, 2008, provisional application No. 61/064,853, filed on Mar. 31, 2008, provisional application No. 61/071,465, filed on Apr. 30, 2008, provisional application No. 61/129,608, filed on Jul. 8, 2008.

(51) Int. Cl.
*G06F 12/00* (2006.01)

(52) U.S. Cl.
USPC ............................................. 711/103; 711/154

(58) Field of Classification Search
USPC ....................................................... 711/103, 154
See application file for complete search history.

(56) References Cited

U.S. PATENT DOCUMENTS

| | | | |
|---|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |

(Continued)

FOREIGN PATENT DOCUMENTS

WO  WO2009053963 A2  4/2009

OTHER PUBLICATIONS

Search Report of PCT Patent Application WO 2009/118720 A3.
Search Report of PCT Patent Application WO 2009/095902 A3.

(Continued)

*Primary Examiner* — Matthew Bradley
(74) *Attorney, Agent, or Firm* — Dentons US LLP

(57) ABSTRACT

A method for reading at least one page within an erase sector of a flash memory device, the method comprising computing at least one mock reading threshold; using the at least one mock reading threshold to perform at least one mock read operation of at least a portion of at least one page within the erase sector, thereby to generate a plurality of logical values; defining a set of reading thresholds based at least partly on the plurality of logical values; and reading at least one page in the erase sector using the set of reading thresholds.

19 Claims, 27 Drawing Sheets

(56) References Cited

U.S. PATENT DOCUMENTS

| | | |
|---|---|---|
| 5,305,276 A | 4/1994 | Uenoyama |
| 5,592,641 A | 1/1997 | Doyle et al. |
| 5,623,620 A | 4/1997 | Fandrich et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg et al. |
| 5,729,490 A | 3/1998 | Calligaro et al. |
| 5,740,395 A | 4/1998 | Hasbun et al. |
| 5,745,418 A | 4/1998 | Hu et al. |
| 5,778,430 A | 7/1998 | Giovannetti et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Choi et al. |
| 2002/0154769 A1 | 10/2002 | Petersen et al. |
| 2002/0156988 A1 | 10/2002 | Sekibe et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong et al. |
| 2003/0192007 A1 | 10/2003 | Miller et al. |
| 2004/0015771 A1 | 1/2004 | Lasser et al. |
| 2004/0030971 A1 | 2/2004 | Shibata et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Chevallier et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |

(56) References Cited

U.S. PATENT DOCUMENTS

| | | |
|---|---|---|
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |

(56) References Cited

U.S. PATENT DOCUMENTS

| | | |
|---|---|---|
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programing Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1.
J.M. Portal, H. Aziza, D. Nee, "EEPROM Diagnosis Based on Threshold Voltage Embedded Measurment", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappor, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Assocation. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.
International Search Report and written opinion for Application No. PCT/IL2008/001232, dated Jan. 28, 2009.

SYSTEM AND METHODS EMPLOYING MOCK THRESHOLDS TO GENERATE ACTUAL READING THRESHOLDS IN FLASH MEMORY DEVICES

CROSS-REFERENCE TO RELATED APPLICATIONS

This application is a National Phase of PCT International Application No. PCT/IL2008/001232, entitled "SYSTEM AND METHODS EMPLOYING MOCK THRESHOLDS TO GENERATE ACTUAL READING THRESHOLDS IN FLASH MEMORY DEVICE", International Filing Date Sep. 17, 2008, published on Jun. 11, 2009 as International Publication No. WO 2009/072102, which in turn claims priority from U.S. Provisional Application No. 61/129,608, filed Jul. 8, 2008, U.S. Provisional Application No. 60/996,782, filed Dec. 5, 2007, U.S. Provisional Application No. 61/064,853, filed Mar. 31, 2008, U.S. Provisional Application No. 61/006,805, filed Jan. 31, 2008, U.S. Provisional Application No. 61/071,465, filed Apr. 30, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems. And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to flash memory devices.

BACKGROUND OF THE INVENTION

Conventional flash memory technology and related technologies are described in the following publications inter alia:

[1] Paulo Cappelletti, Clara Golla, Piero Olivo, Enrico Zanoni, "Flash Memories", Kluwer Academic Publishers, 1999

[2] G. Campardo, R. Micheloni, D. Novosel, "VLSI-Design of Non-Volatile Memories", Springer Berlin Heidelberg New York, 2005

[3] G. Proakis, "Digital Communications," 3rd ed., New York: McGraw-Hill, 1995.

[4] "4-Bit-Per-Cell NROM Reliability". Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar and Eduardo Maayan. Appears on the website of Saifun.com.

[5] Portal, J. M. et al. "EEPROM Diagnosis Based on Threshold Voltage Embedded Measurement". Journal of Electronic Testing: Theory and Applications Volume 21, Issue 1 (January 2005)

[6] Himeno, T.; Matsukawa, N.; Hazama, H.; Sakui, K.; Oshikiri, M.; Masuda, K.; Kanda, K.; Itoh, Y.; Miyamoto, J. "A new technique for measuring threshold voltage distribution in flash EEPROM devices." Microelectronic Test Structures, 1995. ICMTS 1995. Proceedings of the 1995 International Conference on Volume, Issue, 22-25 Mar. 1995 Page(s):283-287 Digital Object Identifier 10.1109/ICMTS.1995.513988

[7] G. Tao, A. Scarpa, J. Dijkstra, W. Stidl and F. Kuper, "Data retention prediction for modern floating gate non-volatile memories", Microelectronics Reliability, Volume 40, Issues 8-10, August-October 2000, Pages 1561-1566

[8] Esseni, D., "Trading-off programming speed and current absorption in flash memories with the ramped-gate programming technique", IEEE Transactions on Electron Devices, 47(4), April 2000.

[9] Portal, J. M. "EEPROM Memory: Threshold voltage built in self diagnosis", ITC International Test Conference, Paper 2.1.

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor, n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a pageful of data, which has typically been defined by a host (data source/destination) or user thereof, as a page, and which is sent by the host to a flash memory device for storage and is subsequently read by the host from the flash memory device.

Mapping: basic cell-level writing function in which incoming digital n-tuple is mapped to a program level by inducing a program level in the cell, having a predetermined correspondence to the incoming logical value.

Physical Page=A portion, typically 512 or 2048 or 4096 bytes in size, of a flash memory e.g. a NAND or NOR flash memory device. Writing and reading is typically performed physical page by physical page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages. Alternatively, a physical page is an ordered set (e.g. sequence or array) of flash memory cells which are all written in simultaneously by each write operation, the set typically comprising a predetermined number of typically physically adjacent flash memory cells containing actual data written by and subsequently read by the host, as well as, typically error correction information and back pointers used for recognizing the true address of a page.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$ where n=number of bits per cell).

Present level, Charge level: The amount of charge in the cell. The Amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: of original physical levels induced in the flash memory cells despite time which has elapsed and despite previous erase/write cycles; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level or "decision level": the voltage (e.g.) against which the charge level of a cell is measured. For example, a cell may be said to store a particular digital n-tuple D if the charge level or other physical level of the cell falls between two threshold values T.

Code rate: ratio of redundancy bits to data bits in flash memory.

Data cells: cells storing data provided by host as opposed to "non-data cells" which do not store host-provided data, and may, for example, store instead error correction information, management information, redundancy information, spare bits or parity bits.

Logical page: a set of bits defined as a page typically having a unique page address, by a host external to a flash memory device.

In the present specification, the terms "row" and "column" refer to rows of cells and columns of cells, respectively and are not references to sub-divisions of a logical page.

The term "MSB" is used herein to denote the bit which is programmed into a multi-level cell, storing several bits, first. The term "LSB" is used herein to denote the bit which is programmed into the multi-level cell, last. The term "CSB" is used herein to denote the bit which is programmed into a 3-level cell, storing 3 bits, second, i.e. after the MSB and before the LSB. It is appreciated that more generally, e.g. if the multi-level cell stores 4 or more levels, there are more than one CSBs and use of the term "CSB" herein, which implies that the cell is a 3-level cell, is merely by way of example and is not intended to be limiting.

A logical page is a set of bytes which is meaningful to an application. The location of a logical page in memory is termed herein a physical page. This location may comprise certain cells in their entirety, or, more commonly, may comprise only one or some bits within certain cells. The locations of each of a logical sequence of logical pages (page 0, page 1, page 2, . . . ) within memory is pre-determined by a suitable mapping scheme mapping logical pages into the bits of the cells of a particular erase sector (block) in flash memory.

"Successfully reconstructed" means that using error correction code, the original logical page has been reconstructed generally satisfactorily, e.g., typically, that the logical page has been read, using reading thresholds, has undergone error correction as appropriate and has successfully passed its CRC (cyclic redundancy check) criterion.

"Bit errors" are those errors found in the physical page corresponding to a logical page, which typically are corrected using. ECC (error correction code) such that the page is successfully reconstructed despite these errors.

The term "reading threshold" and "detection threshold" are used generally interchangeably.

Certain embodiments of the present invention seek to provide improved flash memory apparatus.

There is thus provided, in accordance with at least one embodiment of the present invention, a method for reading at least one page within an erase sector of a flash memory device, the method comprising computing at least one mock reading threshold; using the at least one mock reading threshold to perform at least one mock read operation of at least a portion of at least one page within the erase sector, thereby to generate a plurality of logical values; defining a set of reading thresholds based at least partly on the plurality of logical values; and reading at least one page in the erase sector using the set of reading thresholds.

Further in accordance with at least one embodiment of the present invention, the defining of a set of reading thresholds based at least partly on the plurality of logical values includes estimating a mean and standard deviation of at least one physical level over at least a portion of at least one page belonging to the erase sector of the flash memory device based on the at least one mock reading operation.

Still further in accordance with at least one embodiment of the present invention, the estimating is performed for at least a first physical level residing above a second physical level and below a third physical level and wherein estimating the mean and standard deviations of the first physical level comprises interpolating between previously found means and standard deviations of the second and third levels.

An advantage of the embodiment described above is that a significant amount of computation is saved since it is not necessary to generate a histogram for intermediate physical levels if histograms for physical levels on both sides are known. It is appreciated that alternatively or in addition to claim 3, estimating may be performed for a first physical level even if it does not reside above the second physical level and below the third physical level by extrapolating suitably between previously found means and standard deviations of the second and third levels.

Also provided, in accordance with another embodiment of the present invention, is a method for rapidly assessing functionality of erase sectors in a flash memory, the method comprising estimating a mean and standard deviation of at least one physical level over at least a portion of at least one page belonging to an erase sector of a flash memory device; wherein the estimating is performed for at least a first physical level residing above a second physical level and below a third physical level and wherein estimating the mean and standard deviations of the first physical level comprises interpolating between previously found means and standard deviations of the second and third levels.

Further in accordance with at least one embodiment of the present invention, the defining of a set of reading thresholds based at least partly, on the plurality of logical values includes identifying at least one non-populous region of a predetermined size, within a distribution of physical values of a population of cells belonging to a page within the erase sector.

It is appreciated that non-populous does not mean non-populated i.e. the non-populous regions include only a small number of values but not necessarily zero values.

Still further in accordance with at least one embodiment of the present invention, at least one reading threshold in the set of reading thresholds is determined to be a central value within the non-populous region.

Also provided, in accordance with still another embodiment of the present invention, is a method for assessing effects of retention and cycling on individual erase sectors in a flash memory which has undergone retention and cycling, the method comprising receiving a first centerpoint of a rightmost lobe of a distribution of physical values within the cells of a new flash memory device and a second centerpoint of a rightmost lobe of a distribution of physical values within the cells of an entirely degraded flash memory device; generating a histogram representing distribution of physical values within the cells of an individual erase sector, over a range extending at least between the second and first centerpoints; and computing at least one statistic of a rightmost lobe of the histogram. It is appreciated that there may be only one lobe.

Further in accordance with at least one embodiment of the present invention, at least one statistic comprises at least one of a mean and a standard deviation.

Still further in accordance with at least one embodiment of the present invention, the defining comprises seeking a local maximum in a threshold voltage distribution and determining at least one reading threshold based at least partly on the local maximum.

Additionally in accordance with at least one embodiment of the present invention, the defining comprises seeking a local minimum in a threshold voltage distribution and determining at least one reading threshold based at least partly on the local minimum.

Further in accordance with at least one embodiment of the present invention, the defining comprises identification of a threshold voltage distribution of a highest program level in a probability distribution of physical values within the erase sector; and preventing misidentification of the threshold voltage distribution of the highest program level by comparing the number of cells whose threshold voltage is larger than the candidate maximizing voltage, to a threshold.

Still further in accordance with at least one embodiment of the present invention, the method also comprises guaranteeing a similar number of cells in each program level.

Additionally in accordance with at least one embodiment of the present invention, each time the computing, using, defining and reading are performed, the reading thresholds as most recently modified are stored in a data base in association with characterization information, and the method also comprises, for at least one page in the erase sector: accessing the data base and reviewing at least some of the characterization information to determine whether the database includes reading thresholds suitable for the page; if the database does include suitable thresholds, using the suitable thresholds to read the page; and if the database does not include suitable thresholds, performing the computing, using, defining and reading steps for the page. The database is termed herein "threshold history data base".

It typically stores, as time goes on, a set of thresholds for each row or group of adjacent rows, but not for each erase sector but rather for each category of erase sectors. Typically, a category of erase sectors comprises a set of erase sectors which share a common range of cycling indices and a common range of retention durations. For example, the first category may comprise erase sectors which have undergone up to 100 cycles and whose retention duration is up to 1 month. The second category may comprise erase sectors which have undergone from 101 to 200 cycles and whose retention duration is up to 1 month, and so on, up to a 50th category which may comprise erase sectors which have undergone from 4901 up to 5000 cycles and whose retention duration is up to 1 month. The 51st to 100 categories may comprise erase sectors which have undergone 0-100, 101-200 etc. cycles respectively, and whose retention duration is between 1 and 2 months. The 101th to 150th categories may comprise erase sectors which have undergone 0-100, 101-200 etc. cycles respectively, and whose retention duration is between 2 and 3 months, etc. and so forth, with steps of 1 month between categories for the first year. From the first year to the tenth year, the retention duration increment between categories may be 1 year rather than a single month. The cycling index increment between categories may be uniform e.g. 100 cycles as in this example.

Further in accordance with at least one embodiment of the present invention, the characterization information includes: identification of row neighborhood, number of program/erase cycles which rows in the row neighborhood underwent, and retention period which rows in the row neighborhood endured.

Additionally in accordance with at least one embodiment of the present invention, the guaranteeing comprises scrambling of bits stored in the erase sector. Scrambling may be carried out by the scrambler/descrambler described herein.

Also provided, in accordance with yet another embodiment of the present invention, is a system for reading at least one page within an erase sector of a flash memory device, the system comprising mock threshold computation apparatus operative to compute at least one mock reading threshold; a reading threshold set generator operative to define a set of reading thresholds based at least partly on the plurality of logical values; and reading apparatus using the at least one mock reading threshold to perform at least one mock read operation of at least a portion of at least one page within the erase sector, thereby to generate a plurality of logical values and subsequently using the set of reading thresholds based at least partly on the plurality of logical values to read at least one page in the erase sector using the set of reading thresholds.

Still further provided, in accordance with still another embodiment of the present invention, is a system for rapidly assessing functionality of erase sectors in a flash memory, the system comprising flash memory physical level distribution statistic estimation apparatus estimating a mean and standard deviation of at least one physical level over at least a portion of at least one page belonging to an erase sector of a flash memory device and including interpolation apparatus, wherein the apparatus receives and operates upon at least a first physical level residing above a second physical level and below a third physical level by using the interpolation apparatus to interpolate between previously found means and standard deviations of the second and third levels.

Also provided, in accordance with another embodiment of the present invention, is a system for assessing effects of retention and cycling on individual erase sectors in a flash memory which has undergone retention and cycling, the system comprising a histogram generator operative to generate a histogram representing distribution of physical values within the cells of an individual erase sector, over a range extending at least between a first centerpoint of a rightmost lobe of a distribution of physical values within the cells of a new flash memory device and a second centerpoint of a rightmost lobe of a distribution of physical values within the cells of an entirely degraded flash memory device; and a rightmost lobe analyzer operative to compute at least one statistic of a rightmost lobe of the histogram.

Further in accordance with at least one embodiment of the present invention, the computing comprises translating the mock reading thresholds along a physical value axis of a probability distribution of physical values within the erase sector, according to at least one characteristic of a highest program level within the probability distribution.

According to certain embodiments, an average or central value of a highest lobe in a probability density function graph of logical values read from flash memory may be found, by defining mock thresholds between maximal values identified for a new flash memory device and minimal values identified for an extremely run down (high retention, high cycle count) flash memory device. To do this, a new flash memory device may be taken up at a set up stage, and a large number of cells therein, perhaps one erase-sector full, may be programmed to their highest levels. The erase sector is read, using suitable thresholds whose intervals define a suitable resolution, to determine the location of the top edge of the highest (rightmost) lobe. An extremely run-down flash memory device is then taken up, also at the set up stage, and a large number of cells therein, perhaps one erase-sector full, may be programmed to their highest levels.

The erase sector is read, using suitable thresholds whose intervals define a suitable resolution, to determine the location of the bottom edge of the lowest (leftmost) lobe. It can then be assumed to be the case, that any flash memory device's highest lobe falls within the window between the known bottom edge of the lowest lobe of the run-down flash memory, and the known top edge of the highest lobe of the new flash memory. This is helpful, for example, when it is desired to define mock reading thresholds to identify the location of a highest lobe of a probability density function of an individual flash memory device, wherein the mock reading thresholds are to span all possible locations of the highest lobe. This can be done by distributing mock reading thresholds throughout the entire window described above.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and for memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings.

DETAILED DESCRIPTION OF CERTAIN EMBODIMENTS

Figure 1A:
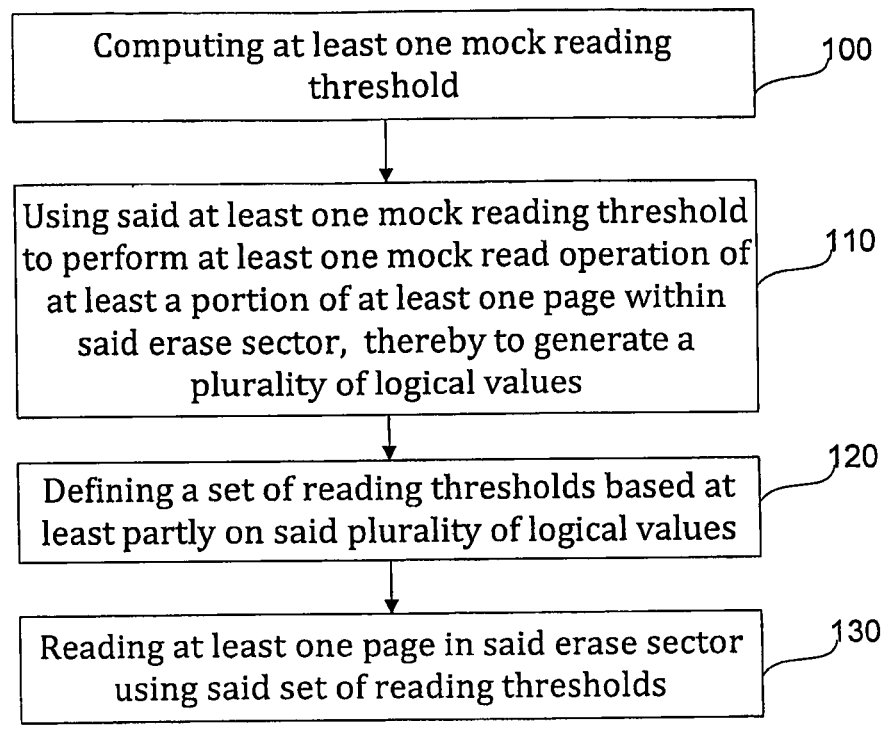
FIG. 1A is a simplified flowchart illustration of a generalized method for reading at least one page within an erase sector of a flash memory device, the method being operative in accordance with certain embodiments of the present invention.
Figure 19:
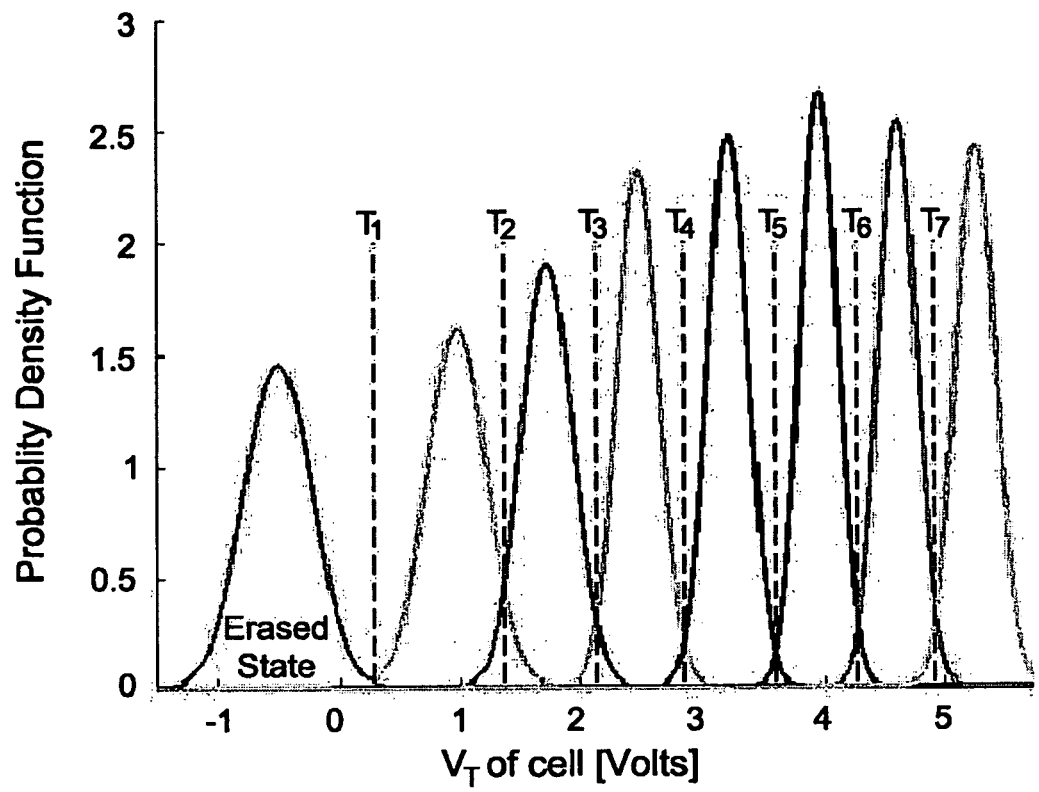
FIG. 19 (prior art) is a simplified theoretical probability density function v, voltage graph showing voltage distributions of program levels, in which the vertical axis represents theoretical physical values conditional on programmed levels.

Reference is now made to FIG. 1A which is a simplified generally self-explanatory flowchart illustration of a generalized method for reading at least one page within an erase sector of a flash memory device, the method being operative in accordance with certain embodiments of the present invention. The method of FIG. 1A typically includes some or all of the following steps, suitably ordered, e.g. as shown:

Step 100: computing at least one mock reading threshold. A mock threshold is a threshold which is far from being an adequate conventional reading threshold useful for reconstructing a logical value from a physical value residing in a flash memory cell. While the mock threshold is used as an input to a reading process, as though it were a true reading threshold, its utility differs. For example, mock thresholds may be used to ascertain the state of health of an erase sector at a certain point in time. Mock thresholds may be used as a reflection of the current locations and shapes of the various lobes of the probability density functions, as shown in FIG. 19, of a particular erase sector or entire flash memory device.

Step 110: using the at least one mock reading threshold to perform at least one mock read operation of at least a portion of at least one page within the erase sector, thereby to generate a plurality of logical values.

Step 120: defining a set of reading thresholds based at least partly on the plurality of logical values.

Step 130: reading at least one page in the erase sector using the set of reading thresholds.

Figure 1B:
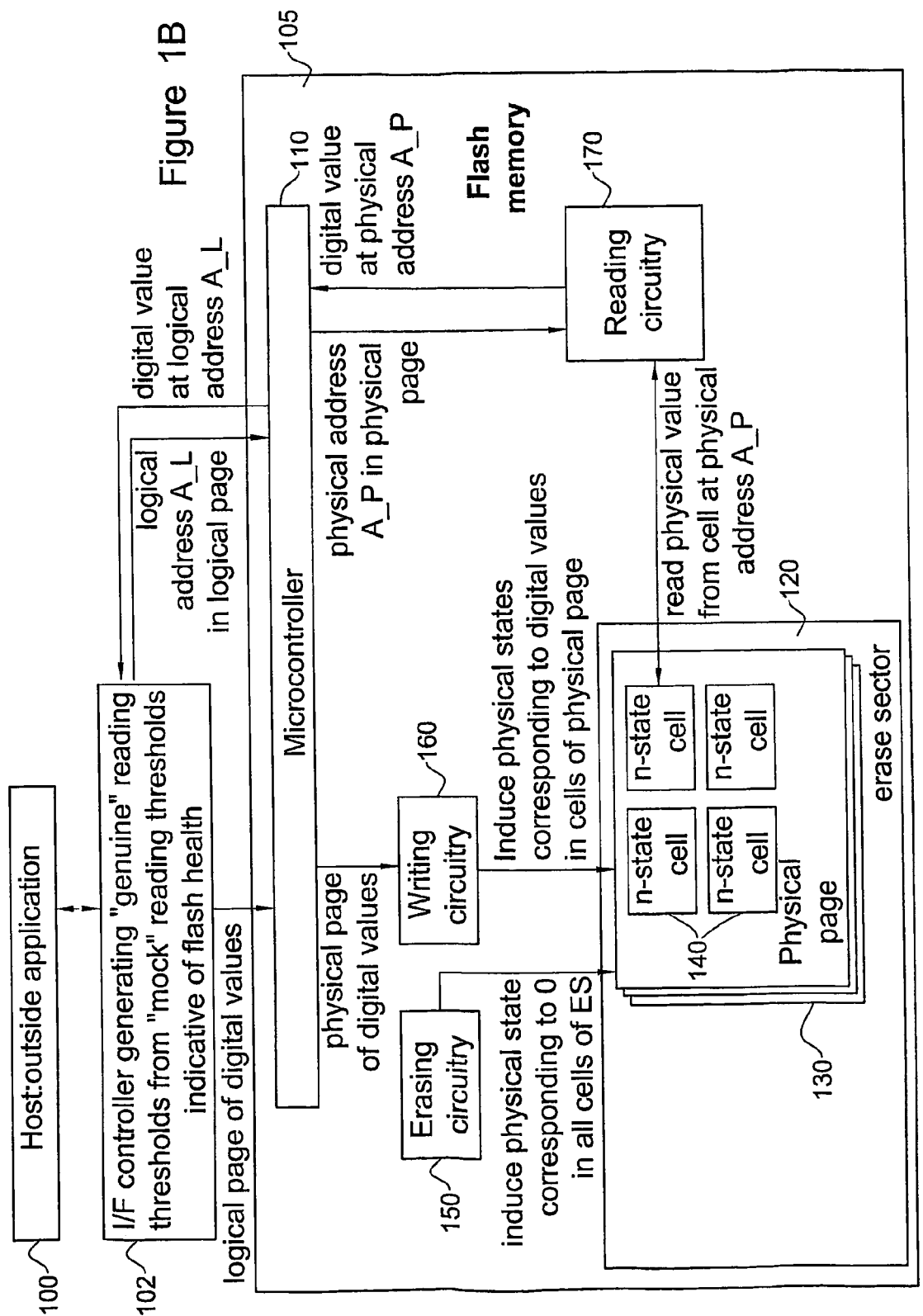
FIG. 1B is a simplified block diagram of a flash memory system constructed and operative in accordance with certain embodiments of the present invention.
Figure 27:
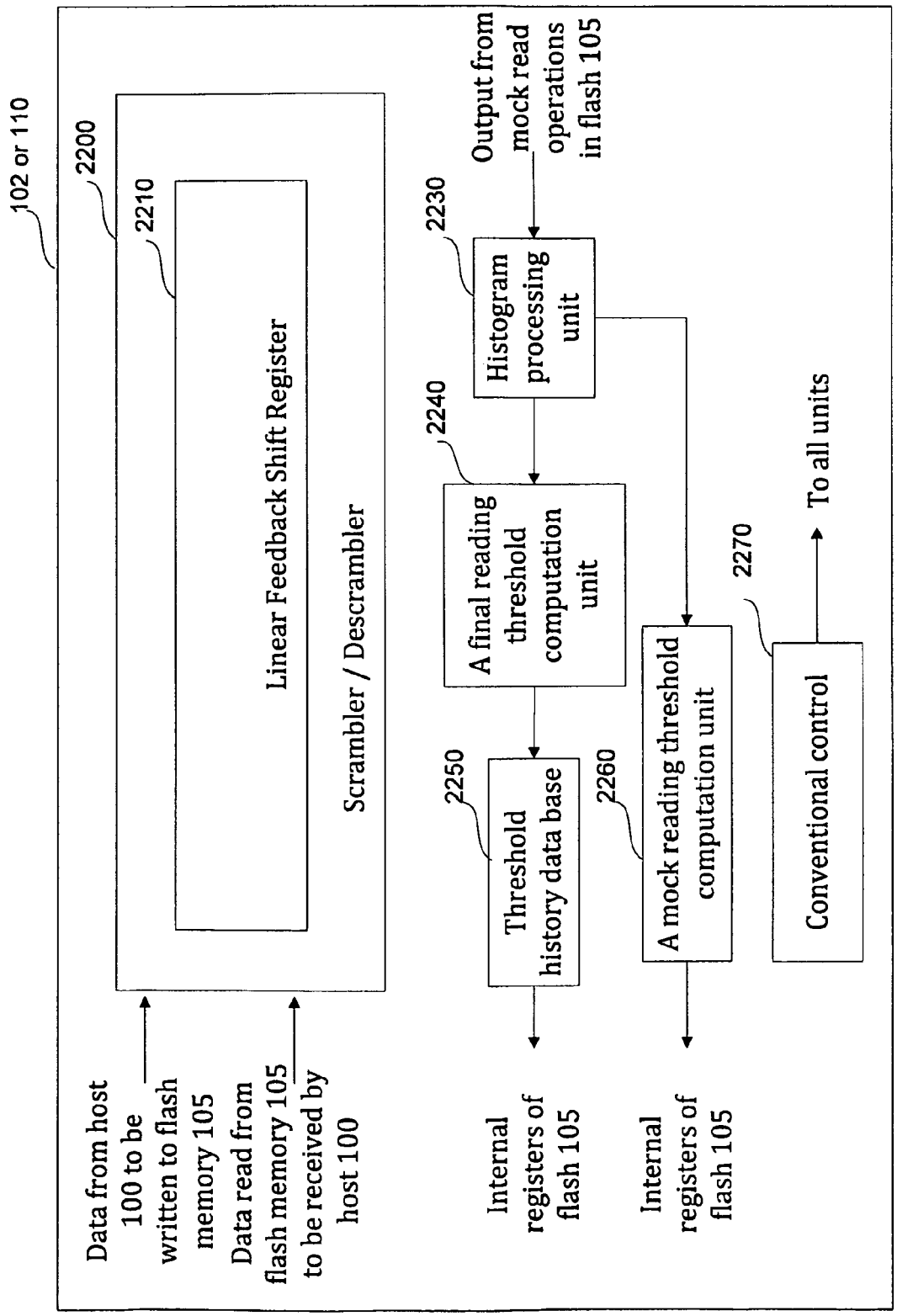
FIG. 27 is a simplified functional block diagram of the external controller of FIG. 1B, according to certain embodiments of the present invention.

Reference is now made to FIG. 1B which is a simplified block diagram of a flash memory system constructed and operative in accordance with certain embodiments of the present invention. As shown, the flash memory system of FIG. 1B includes a host or outside application 100 which interfaces, via an interface controller 102 operative to generate "genuine" reading thresholds from "mock" reading threshold indicative of flash memory health. The controller 102 is typically operative to perform some or all of the methods shown and described herein such as the methods of FIGS. 1A and 2A-2B, with a flash memory device 105. FIG. 27 is a simplified functional block diagram of the controller 102 according to certain embodiments of the present invention.

An internal microcontroller 110 typically manages the functional units of the flash memory device 105. The storage portion of the flash memory device includes one or more typically many erase sectors 120 each storing one or more typically many physical pages 130 each including one or more typically many cells 140 having more than one possible state such that logical values may be stored therein. Erasing circuitry 150 is provided to erase data from cells, writing circuitry 160 writes data into cells, and reading circuitry 170 reads data from cells.

Figure 2A:
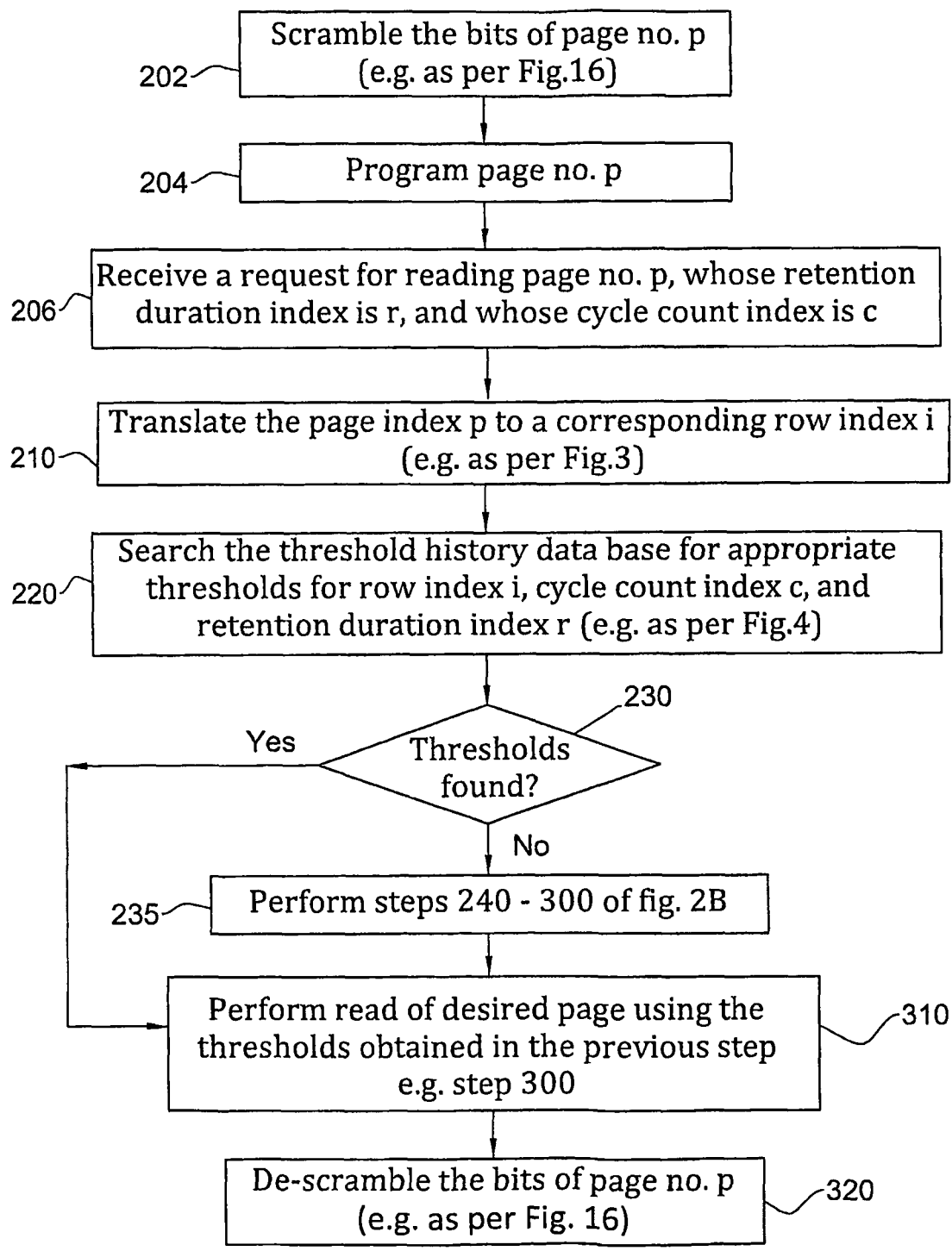
FIGS. 2A-2B, taken together, form a simplified flowchart illustration of an example method implementing the generalized method of FIG. 1A, the method of FIGS. 2A-2B being operative in accordance with certain embodiments of the present invention.
Figure 2B:
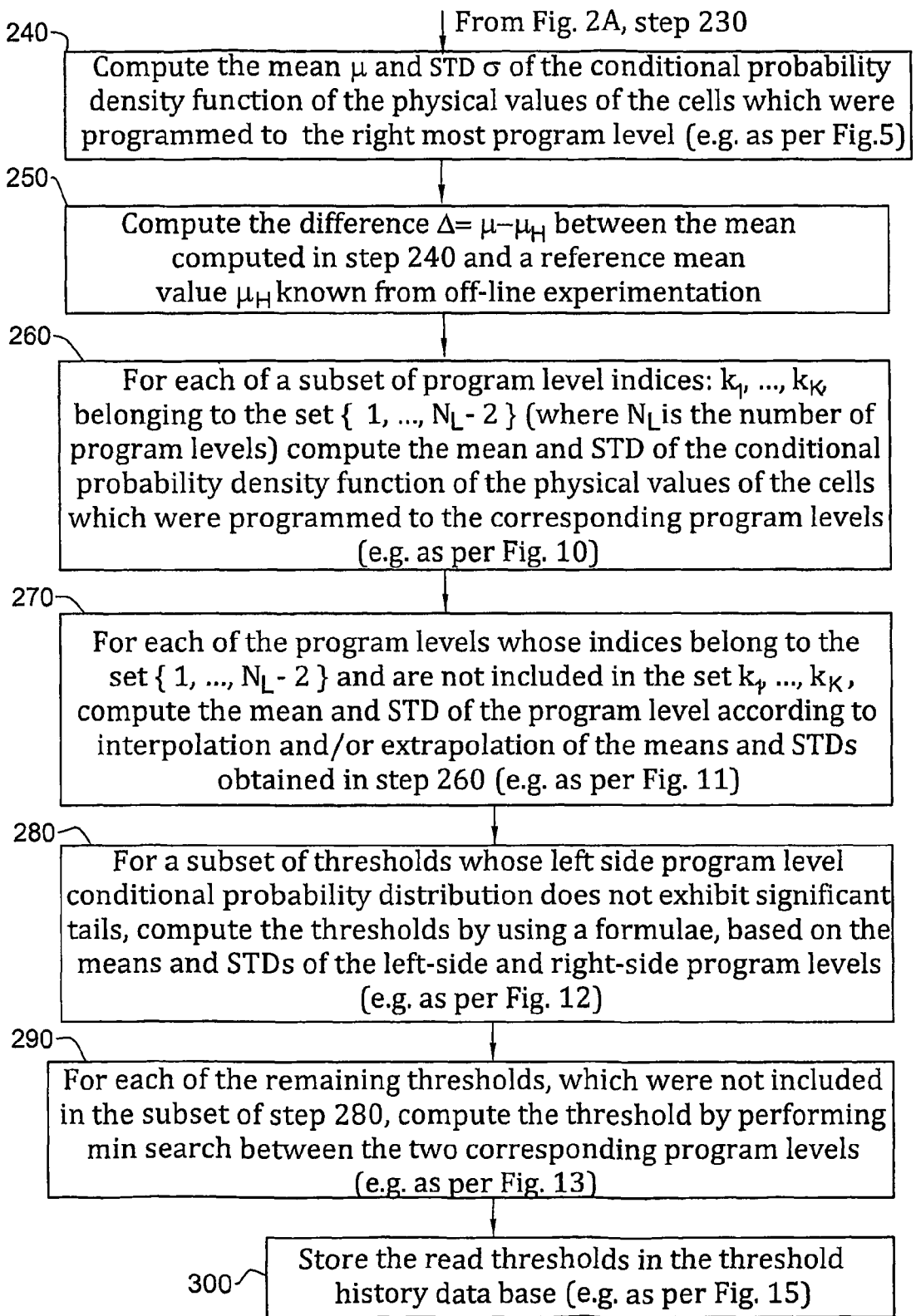

FIGS. 2A-2B, taken together, form a simplified generally self-explanatory flowchart illustration of an example method implementing the generalized method of FIG. 1A, the method of FIGS. 2A-2B being operative in accordance with certain embodiments of the present invention.

Figure 3:
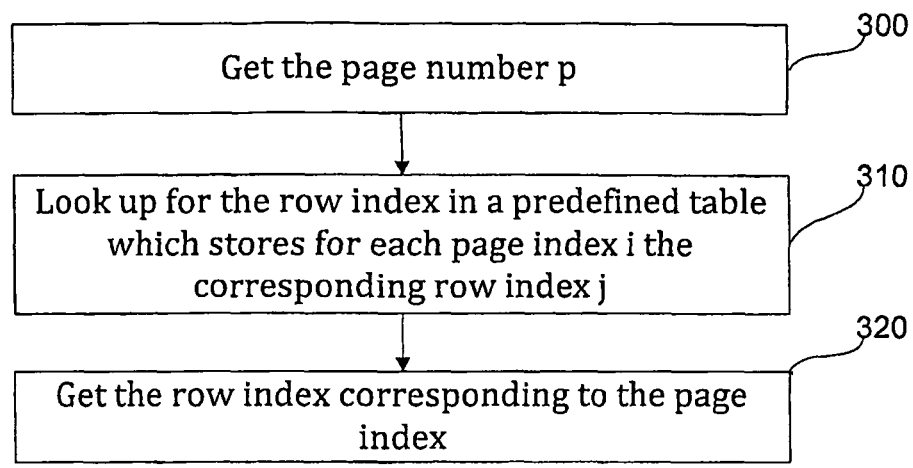
FIG. 3 is a simplified flowchart illustration of a method for performing step 210 of FIG. 2A, the method being operative in accordance with certain embodiments of the present invention.

FIG. 3 is a simplified generally self-explanatory flowchart illustration of a method for performing step 210 of FIG. 2A, the method being operative in accordance with certain embodiments of the present invention.

Figure 4:
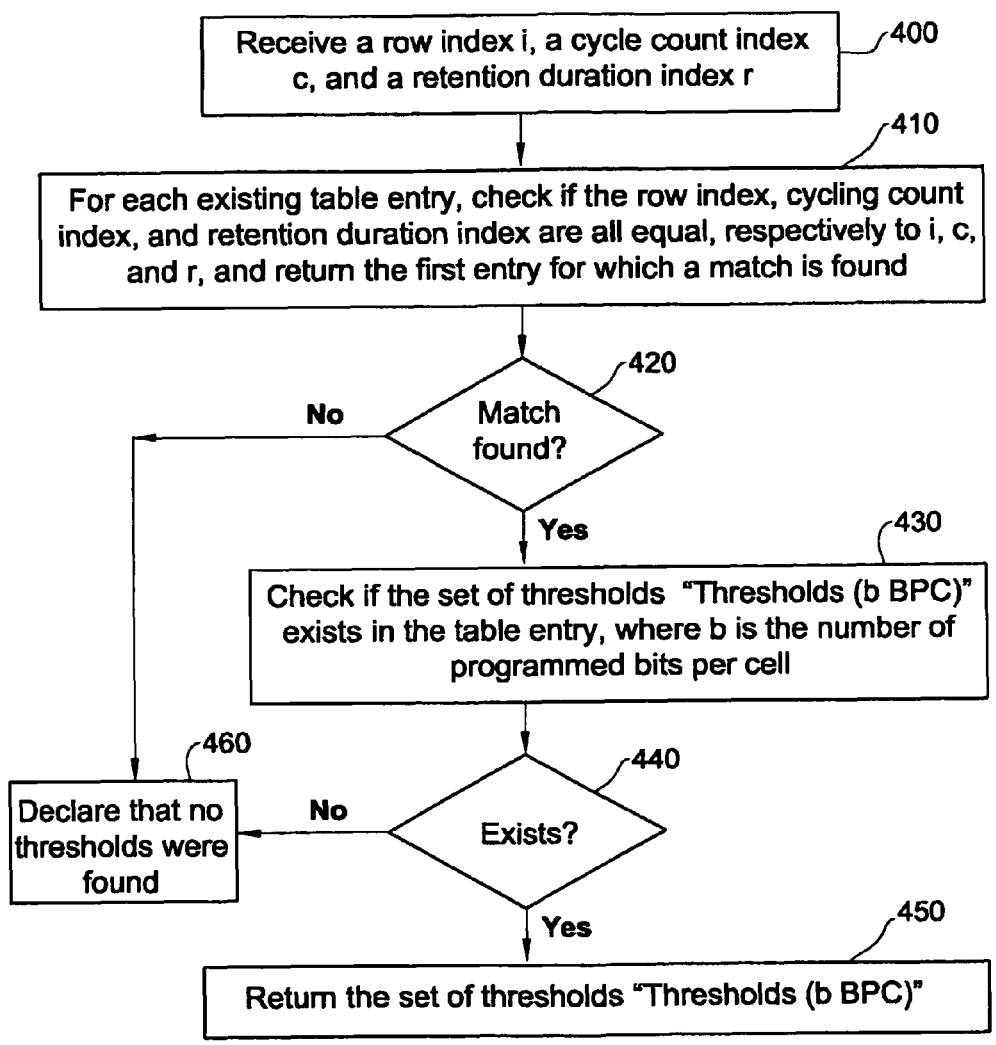
FIG. 4 is a simplified flowchart illustration of a method for performing step 220 of FIG. 2A, the method being operative in accordance with certain embodiments of the present invention.

FIG. 4 is a simplified generally self-explanatory flowchart illustration of a method for performing step 220 of FIG. 2A, the method being operative in accordance with certain embodiments of the present invention. FIG. 2B provides detail of step 235 in FIG. 2A. It is appreciated that a decision as to whether or not a tail effect is present, which impacts on appropriate action which may be taken in each case, occurs in step 280. A "tail effect" is defined herein as a situation in which the right tail of the probability density function of the physical value of a cell decays much slower than the Gaussian probability density. Such a situation can be detected empirically by generating a histogram with a fine grid over the entire voltage range, thereby effectively "taking a picture" of the probability function of the physical values. By examining this distribution it is possible to identify program levels which may exhibit excessive tails in their distribution.

Figure 5:
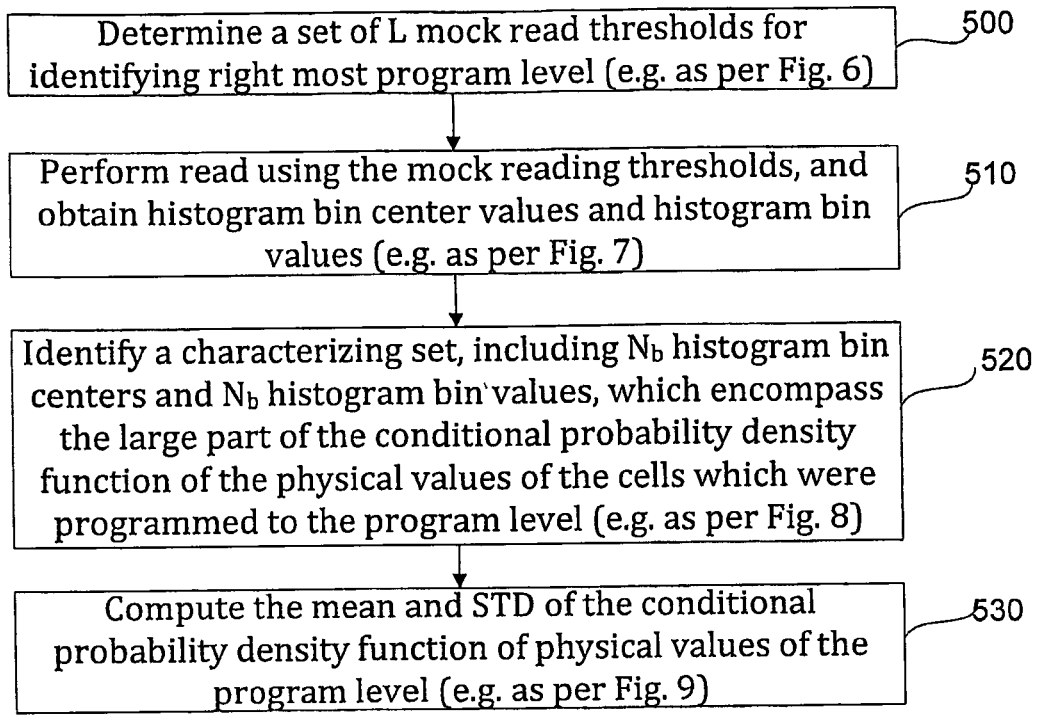
FIG. 5 is a simplified flowchart illustration of a method for performing step 240 of FIG. 2B, the method being operative in accordance with certain embodiments of the present invention.

FIG. 5 is a simplified generally self-explanatory flowchart illustration of a method for performing step 240 of FIG. 2B, the method being operative in accordance with certain embodiments of the present invention.

Figure 6:
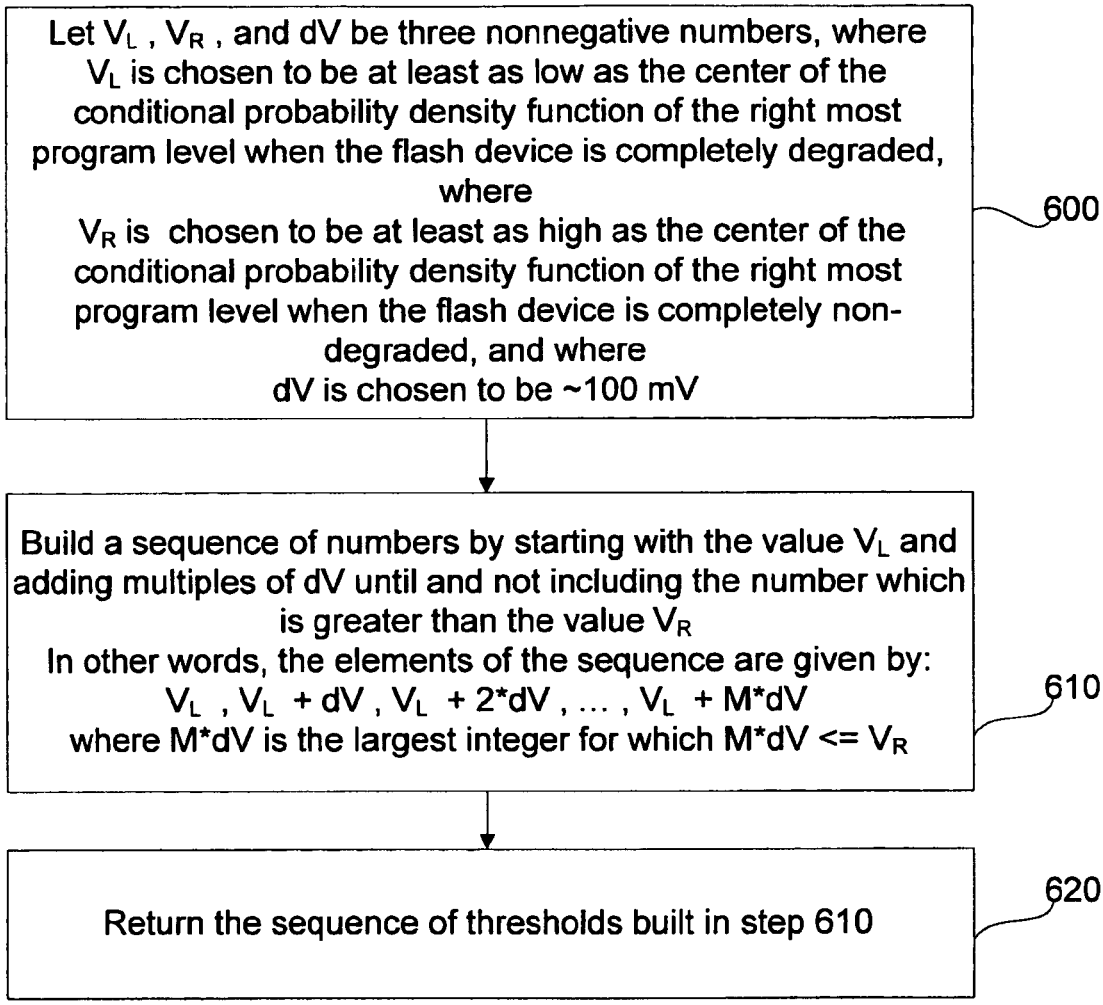
FIG. 6 is a simplified flowchart illustration of a method for performing step 500 of FIG. 5, the method being operative in accordance with certain embodiments of the present invention.

FIG. 6 is a simplified generally self-explanatory flowchart illustration of a method for performing step 500 of FIG. 5, the method being operative in accordance with certain embodiments of the present invention.

Figure 7:
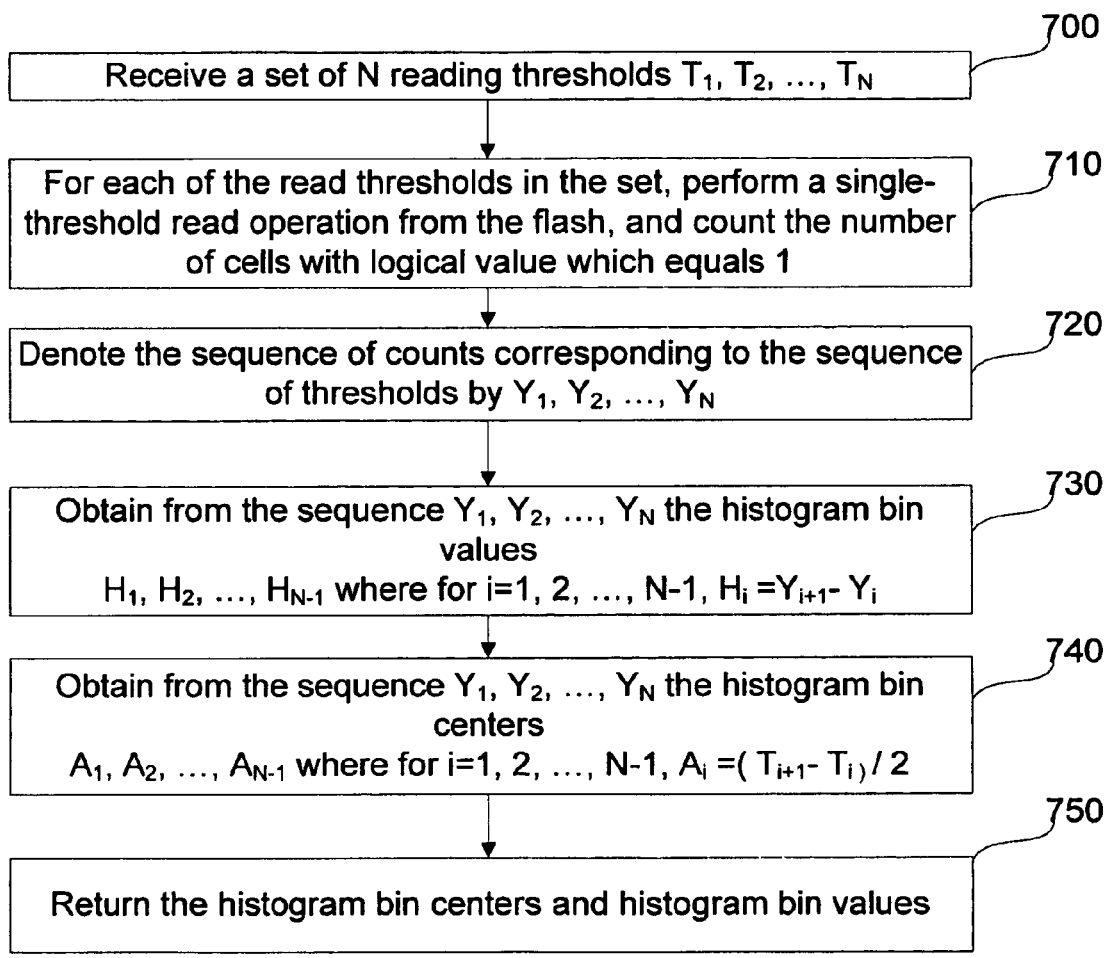
FIG. 7 is a simplified flowchart illustration of a method for performing step 510 of FIG. 5, the method being operative in accordance with certain embodiments of the present invention.

FIG. 7 is a simplified generally self-explanatory flowchart illustration of a method for performing step 510 of FIG. 5, the method being operative in accordance with certain embodiments of the present invention.

Figure 8:
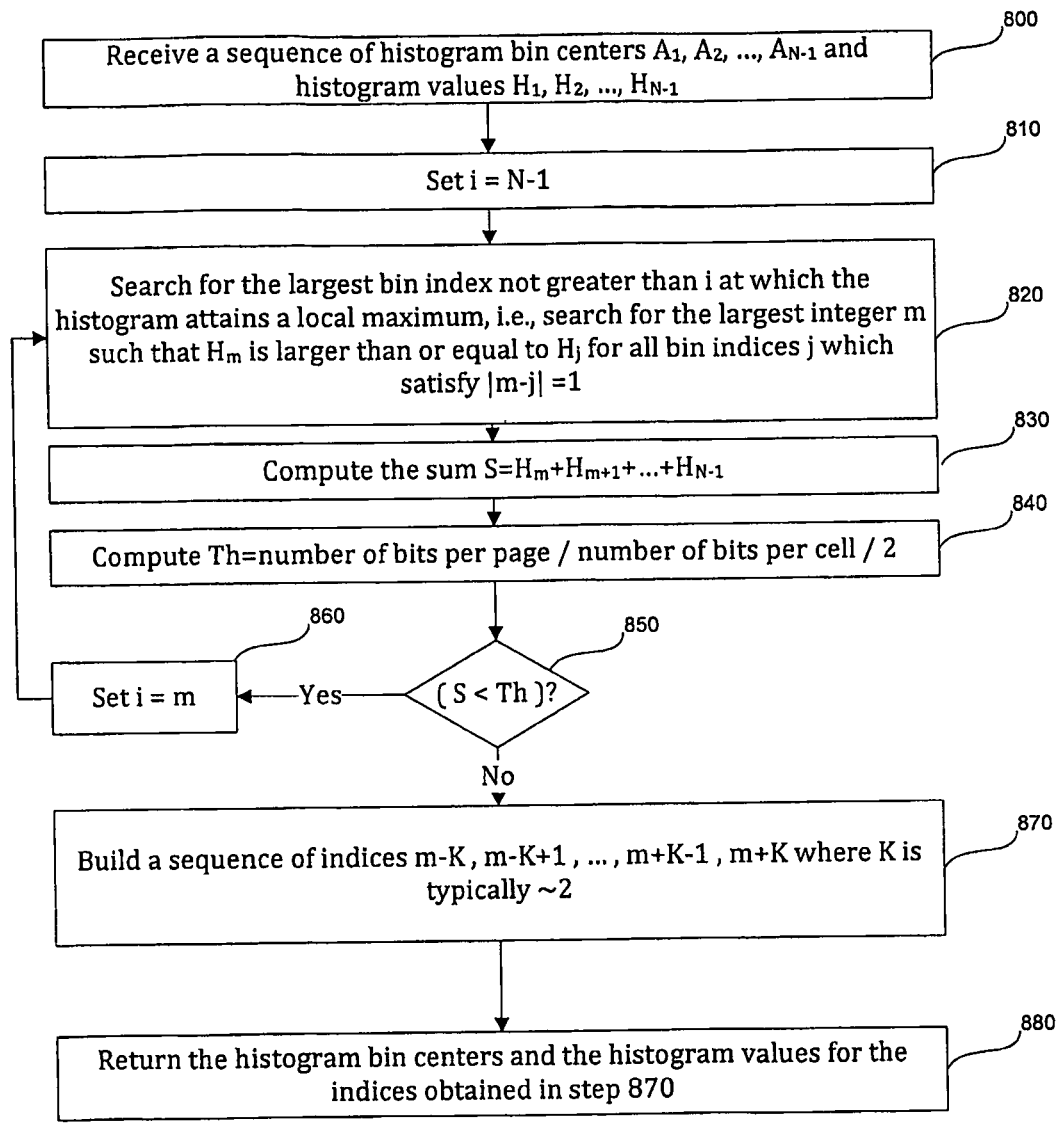
FIG. 8 is a simplified flowchart illustration of a method for performing step 520 of FIG. 5, the method being operative in accordance with certain embodiments of the present invention.

FIG. 8 is a simplified generally self-explanatory flowchart illustration of a method for performing step 520 of FIG. 5, the method being operative in accordance with certain embodiments of the present invention.

Figure 9:
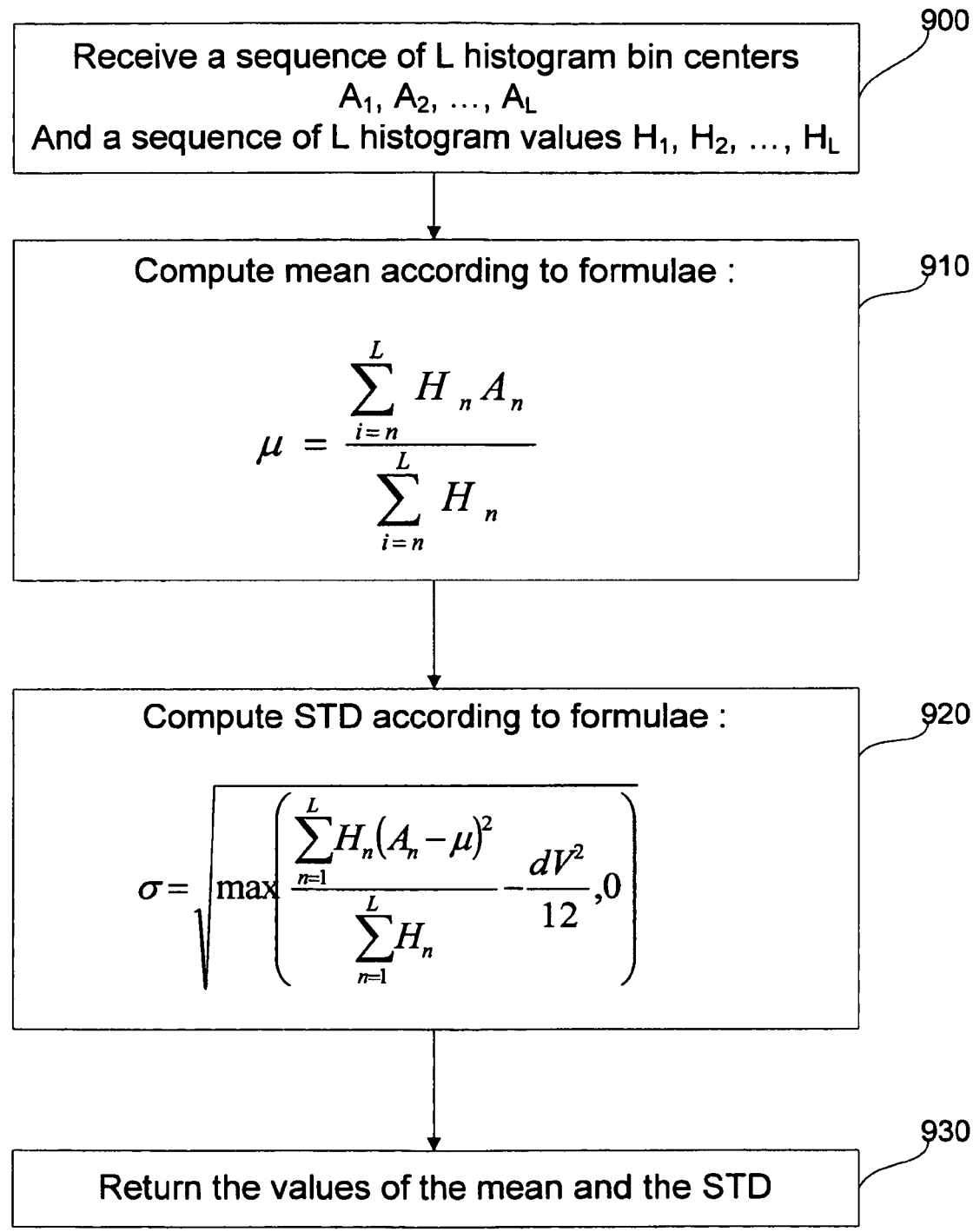
FIG. 9 is a simplified flowchart illustration of a method for performing step 530 of FIG. 5, the method being operative in accordance with certain embodiments of the present invention.

FIG. 9 is a simplified generally self-explanatory flowchart illustration of a method for performing step 530 of FIG. 5, the method being operative in accordance with certain embodiments of the present invention.

Figure 10A:
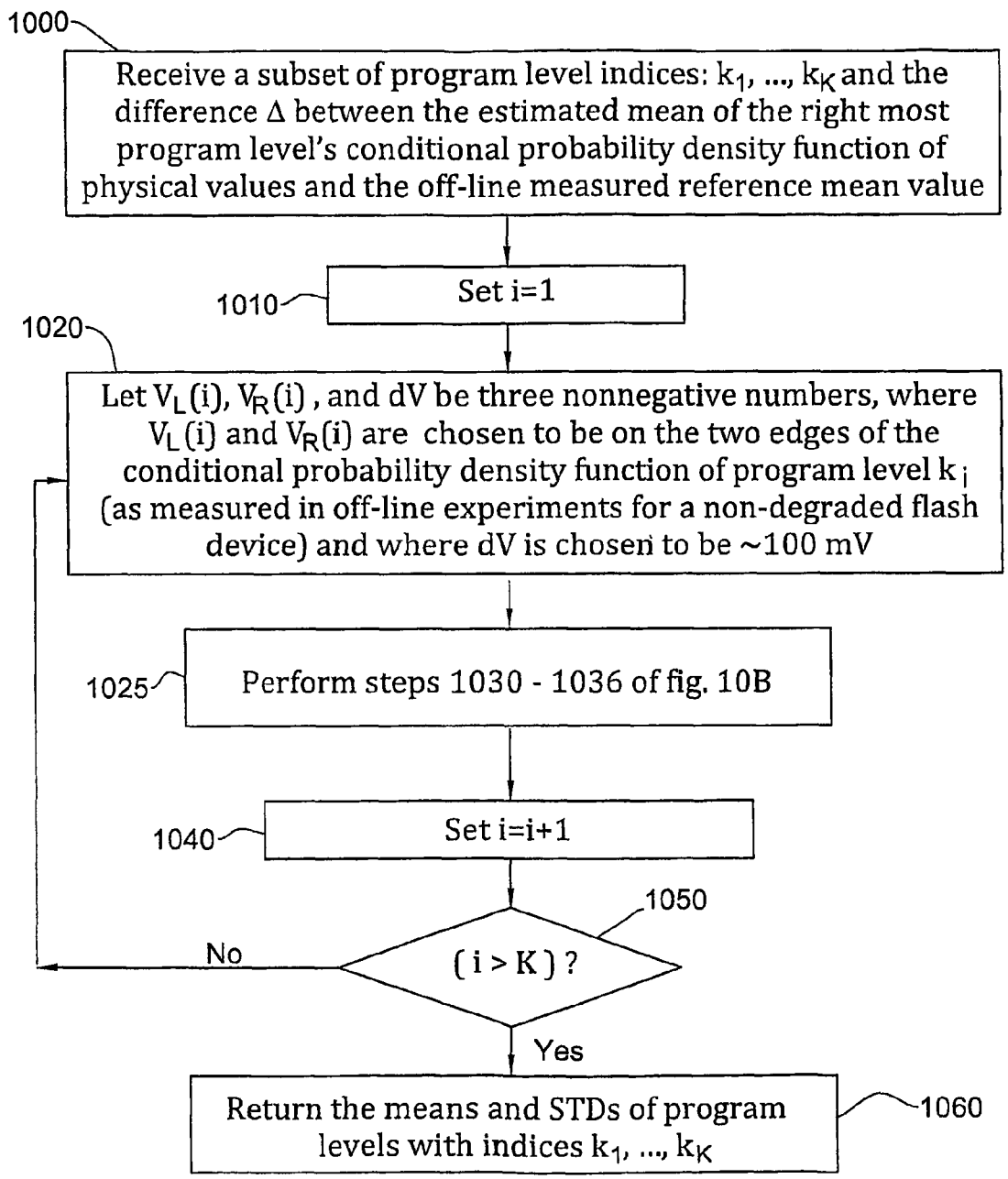
FIG. 10A-10B, taken together, form a simplified flowchart illustration of a method for performing step 260 of FIG. 2B, the method being operative in accordance with certain embodiments of the present invention.
Figure 10B:
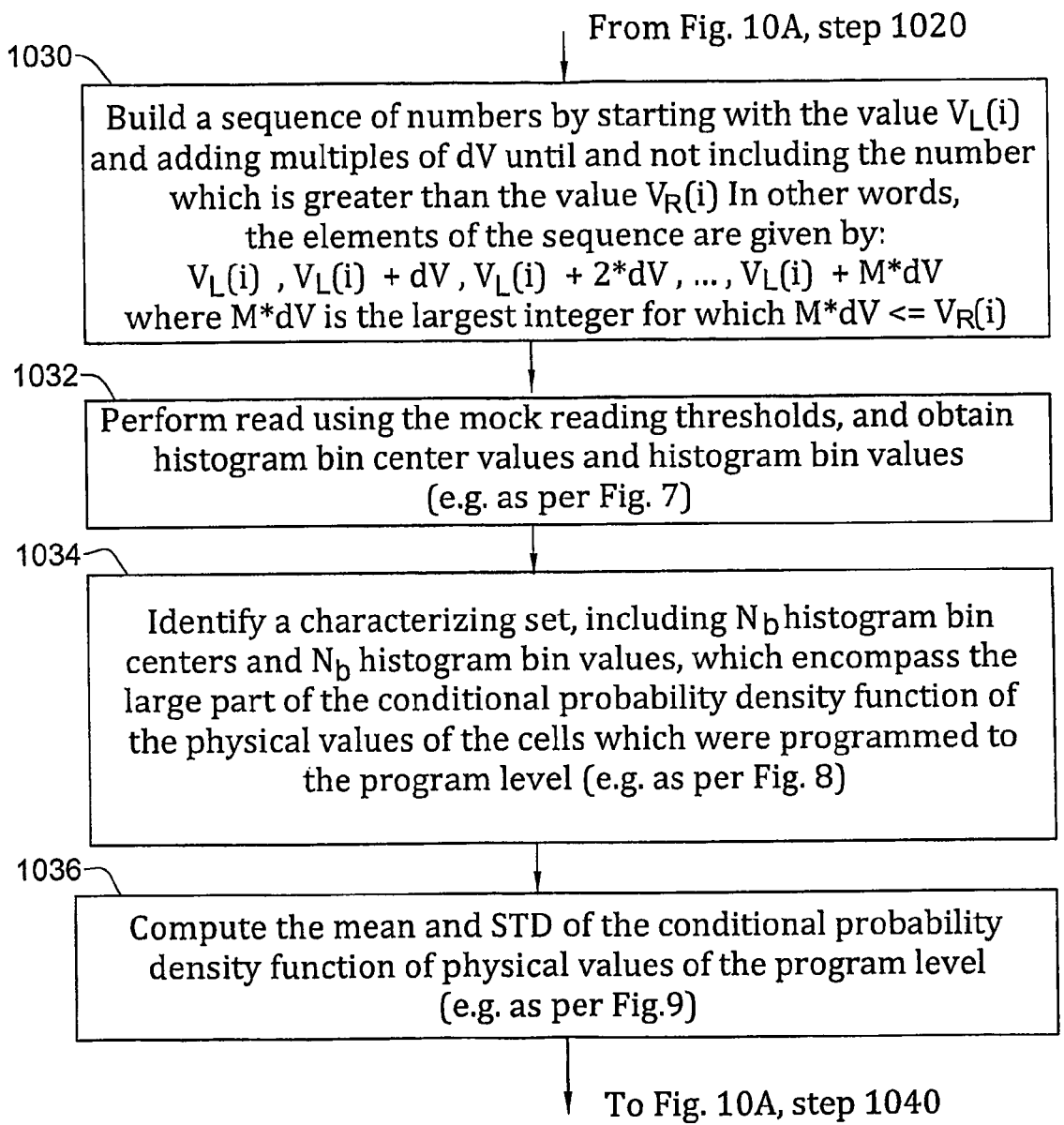

FIG. 10A-10B, taken together, form a simplified generally self-explanatory flowchart illustration of a method for performing step 260 of FIG. 2B, the method being operative in accordance with certain embodiments of the present invention.

Figure 11:
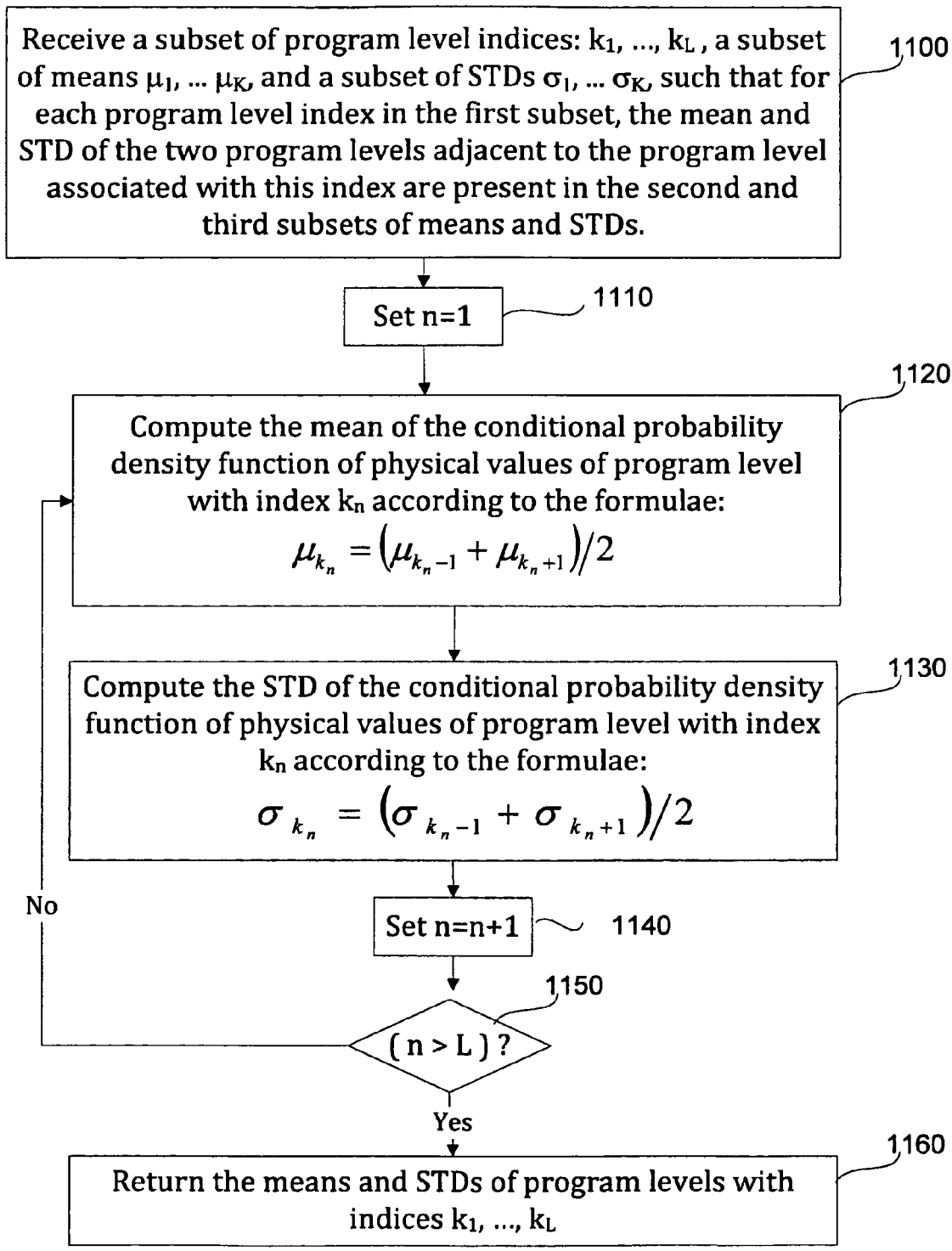
FIG. 11 is a simplified flowchart illustration of a method for performing step 270 of FIG. 2B, the method being operative in accordance with certain embodiments of the present invention.

FIG. 11 is a simplified generally self-explanatory flowchart illustration of a method for performing step 270 of FIG. 2B, the method being operative in accordance with certain embodiments of the present invention.

Figure 12:
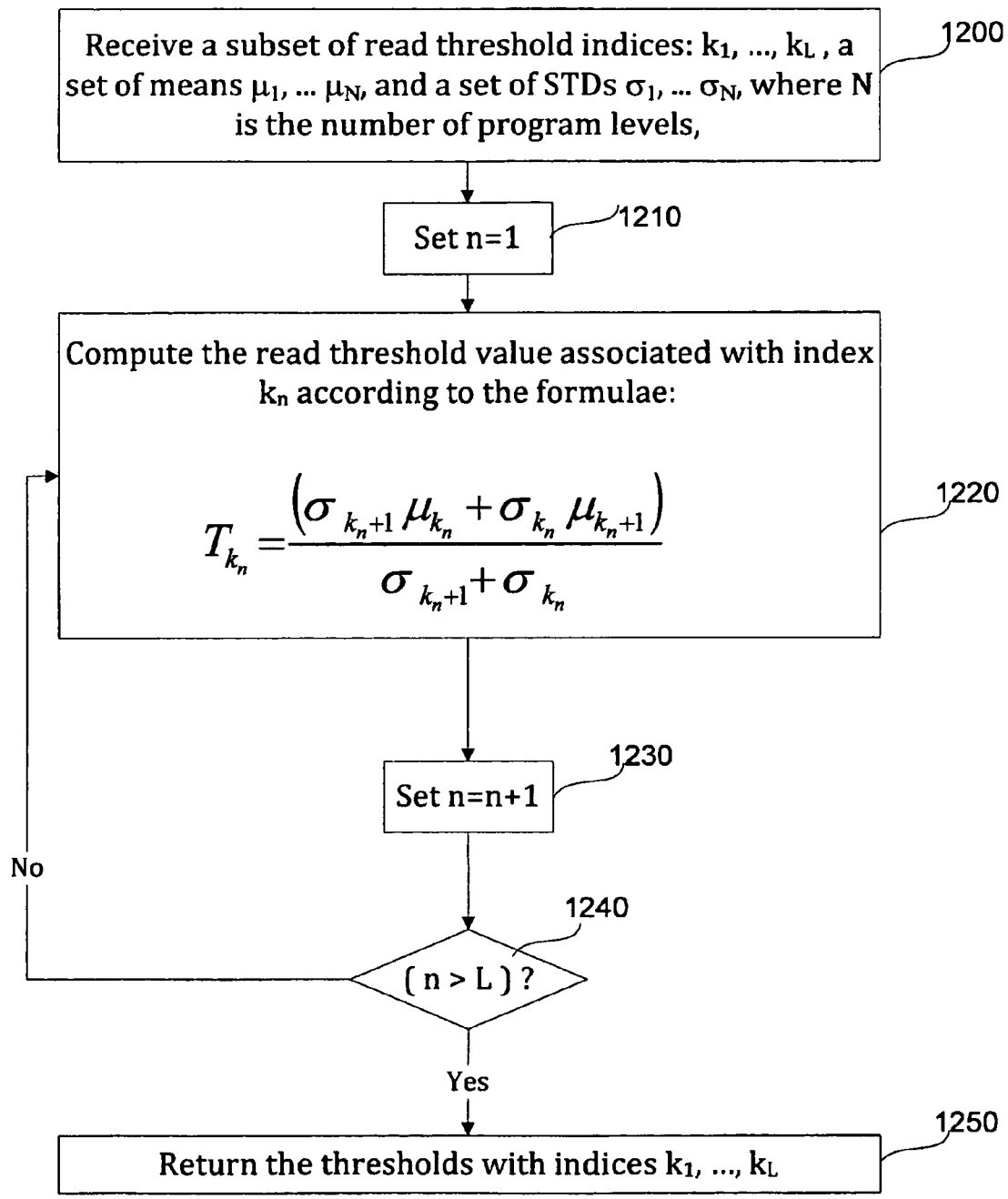
FIG. 12 is a simplified flowchart illustration of a method for performing step 280 of FIG. 2B, the method being operative in accordance with certain embodiments of the present invention.

FIG. 12 is a simplified generally self-explanatory flowchart illustration of a method for performing step 280 of FIG. 2B, the method being operative in accordance with certain embodiments of the present invention.

Figure 13A:
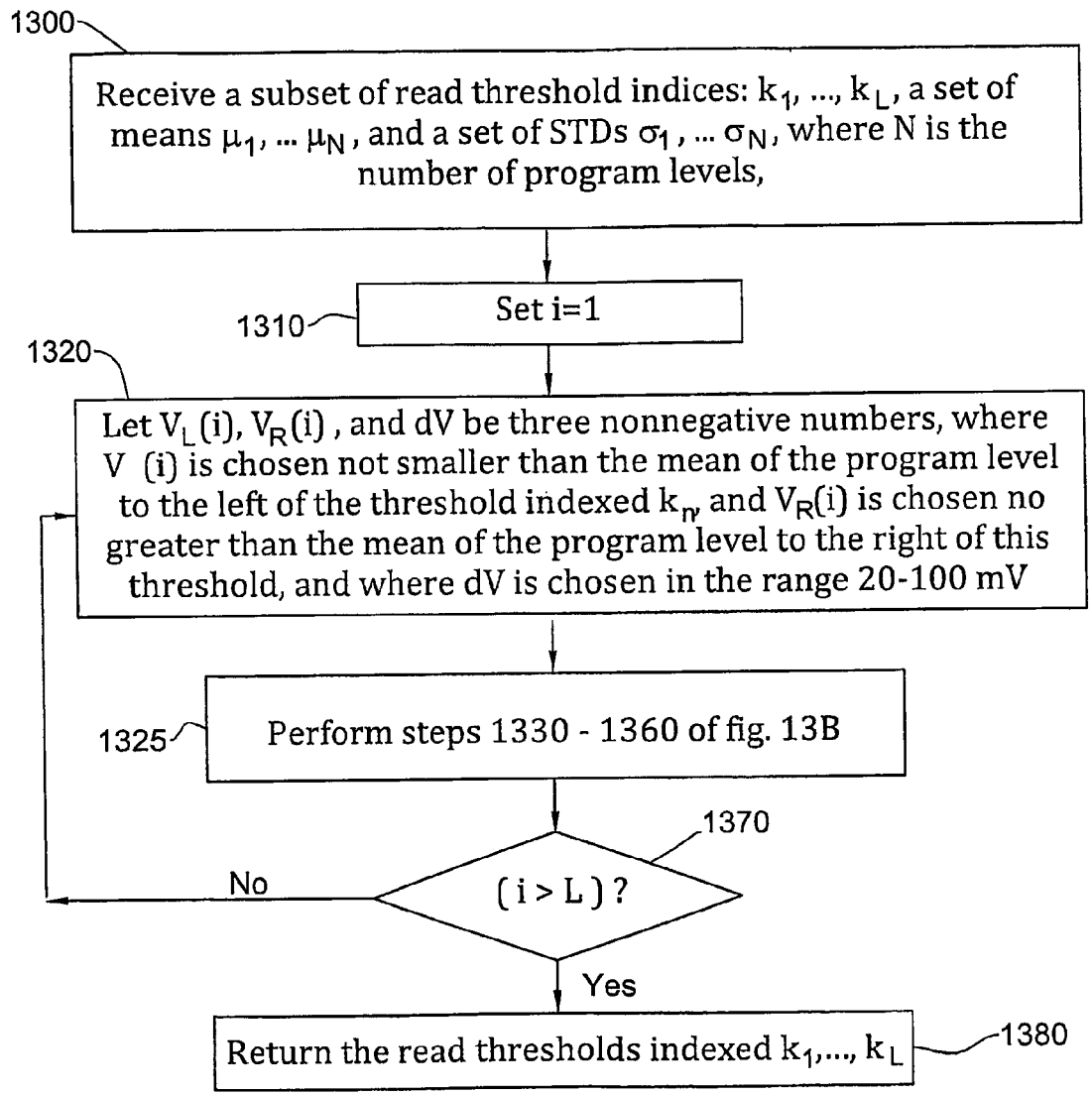
FIG. 13A-13B, taken together, form a simplified flowchart illustration of a method for performing step 290 of FIG. 2B, the method being operative in accordance with certain embodiments of the present invention.
Figure 13B:
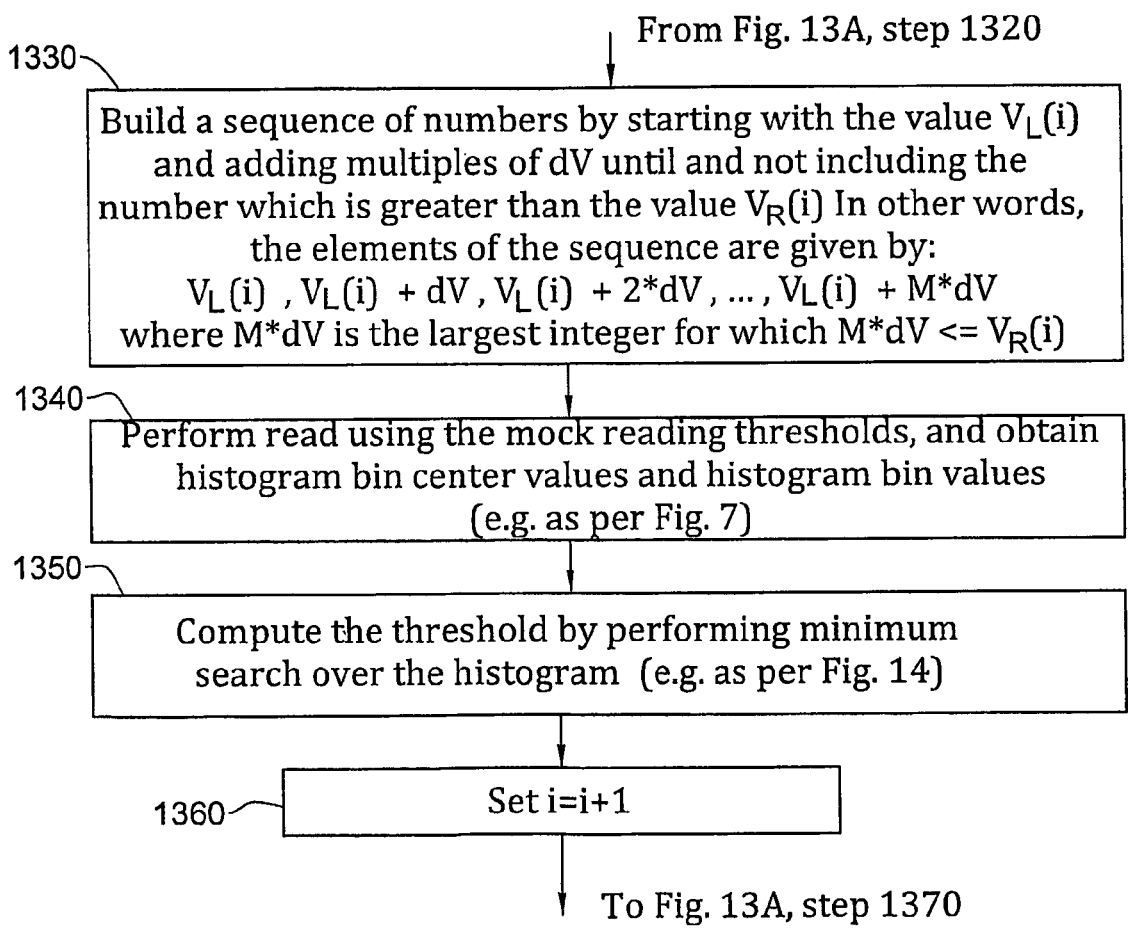

FIG. 13A-13B, taken together, form a simplified generally self-explanatory flowchart illustration of a method for performing step 290 of FIG. 2B, the method being operative in accordance with certain embodiments of the present invention.

Figure 14:
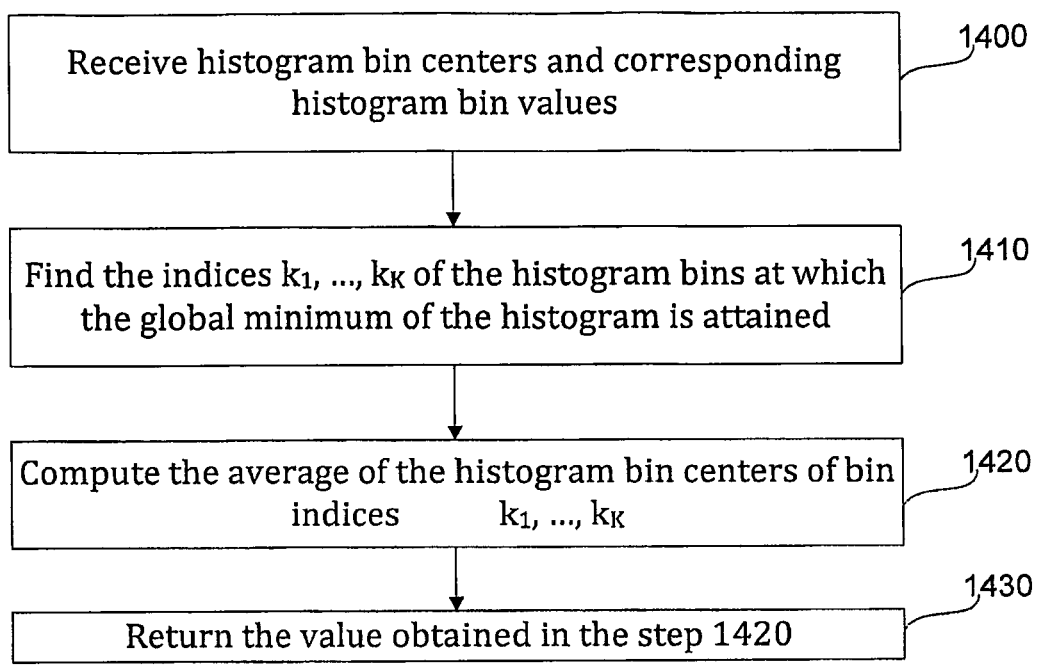
FIG. 14 is a simplified flowchart illustration of a method for performing step 1350 of FIG. 13B, the method being operative in accordance with certain embodiments of the present invention.

FIG. 14 is a simplified generally self-explanatory flowchart illustration of a method for performing step 1350 of FIG. 13B, the method being operative in accordance with certain embodiments of the present invention.

Figure 15:
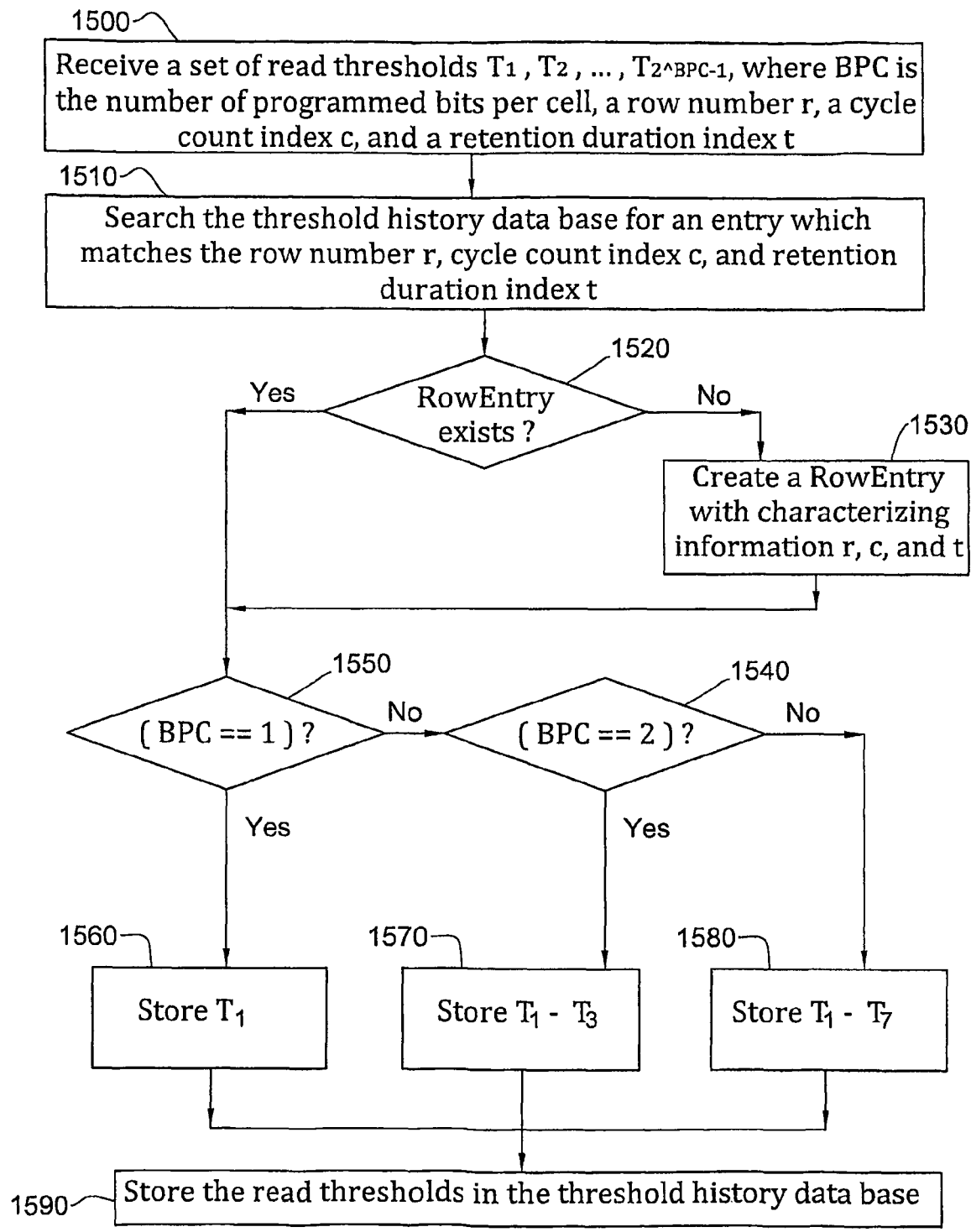
FIG. 15 is a simplified flowchart illustration of a method for performing step 300 of FIG. 2B, the method being operative in accordance with certain embodiments of the present invention.

FIG. 15 is a simplified generally self-explanatory flowchart illustration of a method for performing step 300 of FIG. 2B, the method being operative in accordance with certain embodiments of the present invention. In step 1560, T1 may be stored in MSB thresholds (T1) of thresholds (1 BPC) of RowEntry (r, c, t). In step 1570, T2 may be stored in MSB thresholds (T2) of thresholds (2 BPC) of RowEntry (r, c, t). T1 and T3 may be stored in CSB thresholds (T1, T3) of thresholds (2 BPC) of RowEntry (r, c, t). In step 1580, T4 may be stored in MSB thresholds (T4) of thresholds (3 BPC) of RowEntry (r, c, t). T2 and T6 may be stored in CSB thresholds (T2, T6) of thresholds (3 BPC) of RowEntry (r, c, t). T1, T3, T5 and T7 may be stored in LSB thresholds (T1, T3, T5, T7) of thresholds (3 BPC) of RowEntry (r, c, t).

The acronyms MSB, LSB and CSB are used herein to denote most significant, least significant, and intermediately significant (e.g. in 3-bit-per-cell applications) bits respectively.

Figure 16:
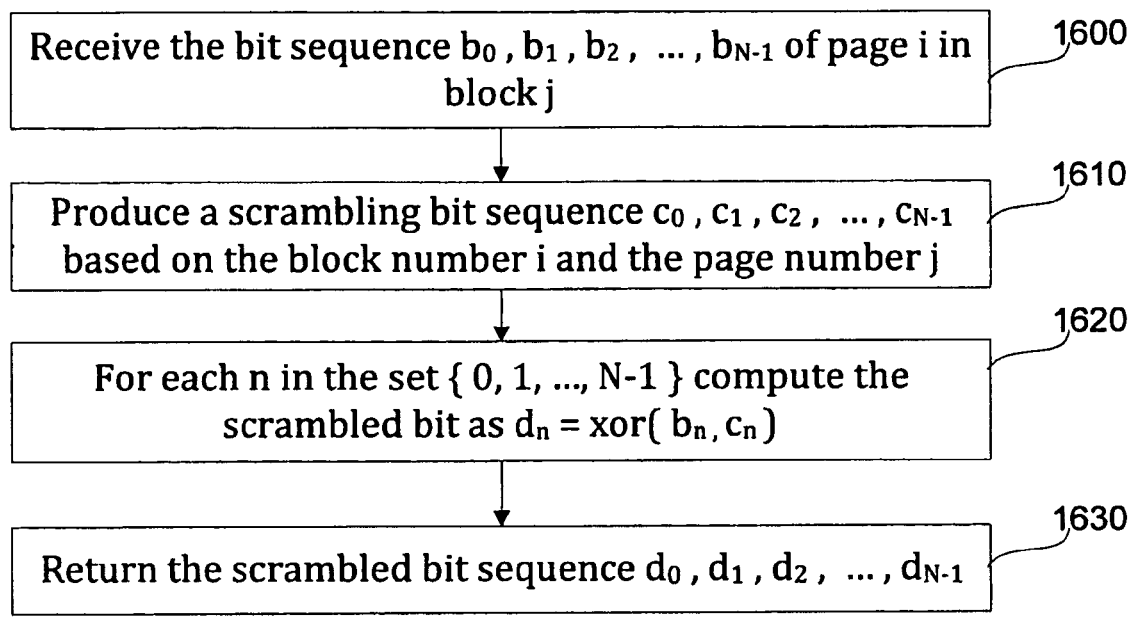
FIG. 16 is a simplified flowchart illustration of a method for performing step 202 of FIG. 2A, the method being operative in accordance with certain embodiments of the present invention.

FIG. 16 is a simplified generally self-explanatory flowchart illustration of a method for performing step 202 of FIG. 2A, the method being operative in accordance with certain embodiments of the present invention.

Figure 17:
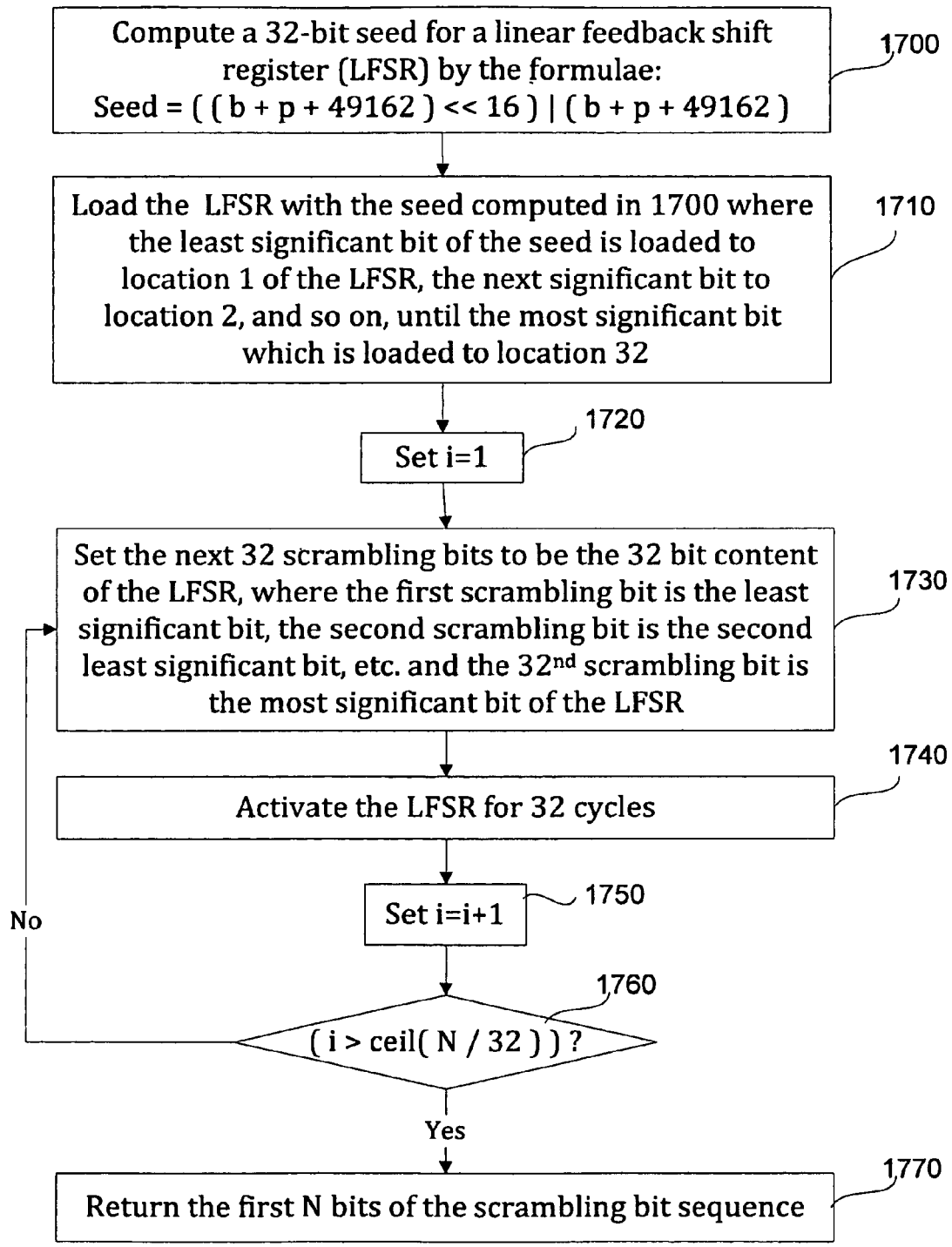
FIG. 17 is a simplified flowchart illustration of a method for performing step 1620 of FIG. 16, the method being operative in accordance with certain embodiments of the present invention.

FIG. 17 is a simplified generally self-explanatory flowchart illustration of a method for performing step 1610 of FIG. 16, the method being operative in accordance with certain embodiments of the present invention.

Figure 18:
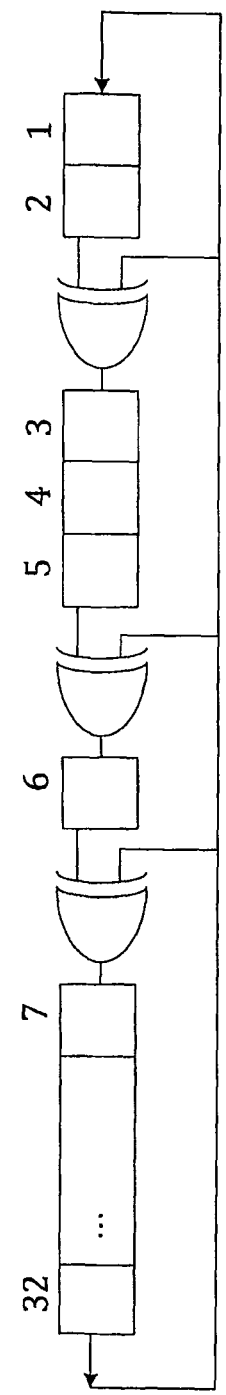
FIG. 18 is a simplified electronic diagram of a linear feedback shift register suitable for implementing a scrambler/descrambler as described herein with reference also to FIG. 27.

FIG. 18 is a simplified generally self-explanatory electronic diagram of a linear feedback shift register suitable for implementing the scrambler/descrambler of FIG. 27.

Design considerations may take into account the following: Conventional flash memory devices store information as charge in "cells", each made of either a floating gate transistor or an NROM transistor. In single-level cell (SLC) devices, each cell stores only one bit of information. Multi-level cell (MLC) devices can store more than one bit per cell by choosing between multiple levels of electrical charge to apply to the floating gates of their cells. The amount of charge (also known as charge level) is then measured by a detector, by comparing the voltage of the transistor gate (also known as charge level and denoted $V_T$) to a decision threshold voltage (also known as charge level boundary point and denoted $V_D$). The amount of charge is then used to determine the programmed level (logical value) of the cell. Due to inaccuracies during the programming procedure and charge loss due to time and temperature (also known as retention), the measured levels suffer from a random distortion.

FIG. 19 illustrates an example of the eight (8) separate probability distributions of a cell which can be programmed with one of eight (8) corresponding program levels (111, 110, 100, 101, 001, 000, 010, and 011, respectively). For each distribution curve, the Y-axis represents the probability that the cell is programmed to the corresponding level, given the value of the charge level $V_T$ (represented by the x-axis).

The cell's programmed level may be determined using several methods. One method is to apply a voltage to the cell's gate and measure if the cell conducts current. The cell has a certain threshold voltage such that if voltage above that threshold is applied to the gate, the gate will conduct. Bellow that threshold voltage the gate will not conduct current (or will conduct a small amount of current, below a certain demarcation level). As the amount of charge in the cell changes this threshold voltage, the charge may be inferred by determining at which voltage the cell starts to conduct current. Thus, the programmed level is determined by iteratively applying different voltages to the gate and measuring whether the cells conduct or not. Another method is based on the fact that when applying a voltage above the threshold voltage, the cell conducts current and the amount of current depends on the difference between the applied voltage and the threshold voltage. As the threshold voltage changes as a function of the amount of charge in the cell, the programmed level may be inferred by measuring the current going through the cell.

Thus, the programmed level may be obtained by simultaneously comparing the conducted current with a given set of fixed currents distinguishing between all programmed levels. In other words, each cell's programmed level is determined by simultaneously comparing the $V_T$ level against several decision threshold levels (reading thresholds). For example, if there are eight (8) possible programmed levels, the cell's $V_T$ is simultaneously compared against seven decision threshold levels which divide the voltage axis into eight (8) regions, as shown in FIG. 19.

In general, if there are L possible program levels, then L-1 decision threshold levels are employed. As the probability distributions extend beyond the decision threshold levels, there is a probability of detection error, i.e. detecting the wrong program level. In order to minimize the detection error, one wishes to set the decision threshold levels optimally. The optimal placement of the decision thresholds levels in terms of minimizing the detection error probability generally depends on the probability distribution associated with the $V_T$ level of the cells. The statistical behavior of the cells' $V_T$ level can be approximated by Gaussian distributions. The optimal placement of the reading threshold for the Gaussian case is a known function, as described e.g. in the above-referenced publication by Proakis, of the means and standard deviations (STDs) of the Gaussian distributions. In other words, knowledge of good decision thresholds (assuming the Gaussian assumption is correct) is possible if the means and standard deviations of the cells' $V_T$ distributions are known.

Since the means and standard deviations of the probability distributions change as a result of cycling and retention, it is not clear how to set the decision thresholds when attempting to read a given page storing information. Setting the decision thresholds to the optimal position corresponding to a fresh flash device might show acceptable performance only if the page was recently programmed and not retained for a significant amount of time. Similarly, setting the decision thresholds to fit a device which was cycled 1000 times and retained for 10 years might not work, i.e. cause too many detection errors, if the page in question was recently written to a non-cycled flash device.

This situation calls for a training stage in which the flash device's controller learns the "state" of the page/block and determines a set of decision thresholds which will yield preferably as little detection errors as possible when used to read the page. One method for performing training involves estimating the state of the flash device from the data bearing cells themselves in order to deduce appropriate reading thresholds without any a-priori knowledge of the data stored in these cells.

The training procedures mentioned above could be performed prior to the reading of every page. In some applications, this approach might turn out expensive in terms of a system's resources. It is therefore important to find ways in which the training procedure comes into play less frequently. One such way, which utilizes a data base of previously obtained training information is described herein.

Certain embodiments of the present invention allow generation of reading threshold values for use when reading data from cells of a flash memory device, without incurring any penalty in terms of a reduction in the number of available cells used for storing data (e.g., without using a "training-sequence"). This is done by employing a "blind" training method in which the probability distributions of the cells' $V_T$ level is estimated based on the actual data bearing cells, whose actual content is in general unknown to the controller. Estimation of the probability distribution of each program level is done by successive read operations which are carried out over the entire page (or a large part thereof) in an appropriate voltage interval. The results of the read operations are translated into an approximate histogram of $V_T$ levels corresponding to a specific program level, and the probability distribution is estimated based on this histogram. Certain embodiments of this invention also include some refinements which allow to trade-off complexity vs. performance, as well as to improve performance in the presence of certain types of non-Gaussian statistics.

Other embodiments of this invention include the usage of a threshold history data base which keeps a list of previously obtained reading thresholds. The data base is organized and used based on the assumption that distinct erase blocks with a similar degradation state, i.e. with a similar cycling counter and similar duration of retention, behave statistically the same. This implies that thresholds which exist in the data base and which were obtained from a certain block with certain degradation characteristics can be used to successfully read another page within another erase block which has undergone similar degradation.

According to certain embodiments, a method for evaluating the unknown degradation state of a first erase block based on certain characteristics indicative of degradation, such as but not limited to cycling index and retention duration, is provided. The first erase block is matched with a second erase block sharing the same characteristics, whose degradation state is known. If the two erase blocks share the same characteristics, the known degradation state of the second is taken to be the degradation state of the first.

For clarity, the specification and drawings at times relate specifically to a flash memory device where each cell has eight (8) possible charge levels (or program levels), thus storing 3 bits per cell. It is appreciated however that certain embodiments of this invention are also applicable to flash devices with less or more charge levels. The page to be read has typically been written to a flash device after an unknown number of program/erase cycles, and the data in the page has been retained for an unknown period of time. Denote the number of cells in the page by $N_c$. Denote the means of the cells' $V_T$ level distributions by $\mu_1, \mu_2 \ldots, \mu_8$, where the index 1 corresponds to the erase level, index 2 corresponds to the program level closest to the erased state, and so on. Furthermore, denote by $\sigma_1, \sigma_2, \ldots, \sigma_8$, the standard deviations (STDs) of these distributions, respectively. Finally, denote by $T_1, T_2 \ldots, T_7$, the reading thresholds which are to be used for reading the page. An approximation to the optimal reading thresholds is given by the following formulae, e.g. as described herein in FIG. 2B, step 280 and in FIG. 12:

$$T_k = \frac{\sigma_{k+1}\mu_k + \sigma_k\mu_{k+1}}{\sigma_k + \sigma_{k+1}}, \quad k = 1, 2, \ldots, 7.$$

Fine Estimation of the Mean and standard deviation of the Highest Program Level, according to certain embodiments of the present invention, is now described in detail.

Figure 20:
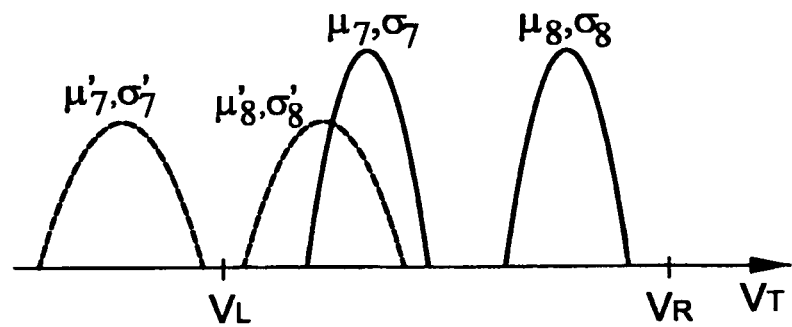
FIG. 20 is a graph of a threshold voltage distribution of a highest program level which is useful in understanding the highest program level mean and standard deviation fine estimation methods shown and described herein.

In one embodiment of the present invention, the mean and standard deviation of the probability distribution of the $V_T$ level of the cells programmed to the highest program level are estimated e.g. as illustrated herein in FIG. 2B at step 240 and in FIG. 5. An example of the threshold voltage distribution of the two (2) highest program levels is shown in FIG. 20. The solid line corresponds to a fresh cell which underwent little (if any) program-erase cycles and whose data was retained for a very short period of time. The (Gaussian) probability distribution of the threshold voltage of these cells is determined by their means $\mu_7$, $\mu_8$ and standard deviations $\sigma_7$, $\sigma_8$. The dashed line corresponds to used cells which were subjected to 1000 program-erase cycles and whose data was retained for 10 years. The (Gaussian) probability distribution of these cells is designated by the means $\mu'_7$, $\mu'_8$ and standard deviations $\sigma'_7$, $\sigma'_8$.

The flash device typically supports a read operation in which the threshold levels of all the cells in a given page are compared simultaneously against some fixed voltage. Specifically, if the read operation is given a voltage $V_0$, then each cell which conducts current after applying this voltage to its gate is read as 1, and each cell which does not conduct current is read as 0.

Several such read operations can be performed successively with a sequence of voltages which span the interval $[V_L, V_R]$ e.g. as shown in FIGS. 2A-2B. In particular, assume that for a prescribed value dV, the sequence of read voltages is given by $$V_L, V_L+dV, V_L+2dV, V_L+3dV, \ldots, V_R$$

e.g. as shown in FIG. 5 at step 500 and in FIG. 6.

Once these read operations are done, it is possible to obtain a sampled histogram of the threshold voltages in the voltage range. Assume that $V_R - V_L = M*dV$, where M is an integer, and let H(m), m=1, 2, . . . , M, be the sampled histogram of the threshold voltage, i.e. H(1) holds the number of cells whose threshold voltage lies in the interval $[V_L, V_L+dV]$, H(2) holds the number of cells whose threshold voltage lies in the interval $[V_L+dV, V_L+2*dV]$ and so on. Finally, H(M) holds the number of cells whose threshold voltage lies in the interval $[V_L+(M-1)*dV, V_R]$. Also, for future reference, denote by A(m), m=1, 2, . . . , M, the sequence of center points of the histogram's intervals, i.e., A (m)=$V_L+(m-½)*dV$, e.g. as shown in FIG. 5 at step 510 and in FIG. 7.

Next, if the page in question belongs to a fresh block, it is expected that the sequence H(m) will exhibit two local maxima corresponding to the two highest program levels (see solid curve in FIG. 20. At the other extreme, if the page was cycled and its data retained, it is expected that only one maximum will be noticed, close to the left end of the voltage interval $[V_L, V_R]$.

In order to estimate the mean and standard deviation of the highest program level, a subset of histogram values is identified, which corresponds to the highest program level. This is done by searching for the first bin from the right at which a local maximum is attained. Regardless of the state of the flash device in question, the first significant maximum from the right will always correspond to the highest program level, e.g. as shown in FIG. 5 at step 520 and in FIG. 8.

Once the maximizing bin is identified, several bins may be taken from either side of that bin and accounted for as belonging to cells in the highest program level. Denote by m* the first bin index from the right at which the histogram posses a local maximum. Then, e.g. as shown in FIG. 5 at step 530 and in FIG. 9, the mean and standard deviation of the highest program level can be estimated as follows:

$$\mu = \frac{\sum_{k=m^*-N_B}^{m^*+N_B} H(k)A(k)}{\sum_{k=m^*-N_B}^{m^*+N_B} H(k)}$$

$$\sigma = \sqrt{\max\left(\frac{\sum_{k=m^*-N_B}^{m^*+N_B} H(k)(A(k)-\mu)^2}{\sum_{k=m^*-N_B}^{m^*+N_B} H(k)} - \frac{dV^2}{12}, 0\right)},$$

where $N_B$ is chosen on the one hand to guarantee that all the distribution mass of the highest program level is accounted for, and on the other hand to prevent penetration of cells from lower program levels into the computation. The term $$\frac{dV^2}{12}$$

accounts for the quantization noise stemming from the sampling of the histogram.

Fine Estimation of the Mean and standard deviation of the Intermediate program Levels according to certain embodiments of the present invention, is now described in detail.

In one embodiment of the present invention, the means and standard deviations of the remaining program levels can be estimated as described hereinabove. To this end, one can define appropriate intervals $[V_L^{(i)}, V_R^{(i)}]$, i=1, 2, . . . for each program level and repeat the procedure described herein.

Figure 21:
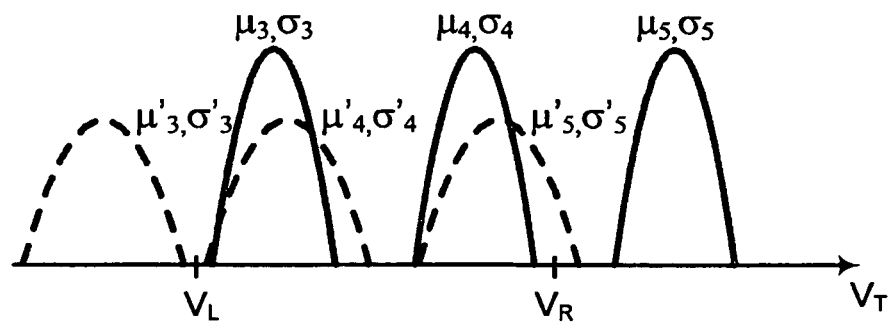
FIG. 21 is a graph of a threshold voltage distribution of an intermediate program level which is useful in understanding the intermediate program level mean and standard deviation fine estimation methods shown and described herein.

As opposed to the case of the highest program level, it is not always clear that such intervals exist which prevent ambiguity in identifying the part of the histogram which relates to the desired program level. This situation is illustrated in FIG. 21. As shown, the threshold voltage distributions of program levels 3, 4, and 5 are depicted. The solid curves correspond to fresh devices, while the dashed curves correspond to devices which underwent substantial cycling and retention. If it is desired to estimate the mean and standard deviation of program level 4, then in order to allow estimation of the mean and standard deviation in fresh flash devices as well as in cycled and retained flash arrays, the voltage window depicted in FIG. 21 may be selected. In particular, the right edge of the interval typically contains the lobe of program level 4 in a fresh device, and the left edge of the interval typically ensures that program level 4 is captured in cycled and/or retained devices. However, given the histogram of a device whose cycle count and retention are unknown, it is not clear which local maximum corresponds to program level 4. In a fresh device, it will be the maximum on the right side of the voltage interval, and in cycled and retained devices the maximum on the left side of the voltage interval corresponds to this program level. In order to circumvent this problem, adaptive voltage windows may be defined which are determined according to the mean of the highest program level.

Figure 22:
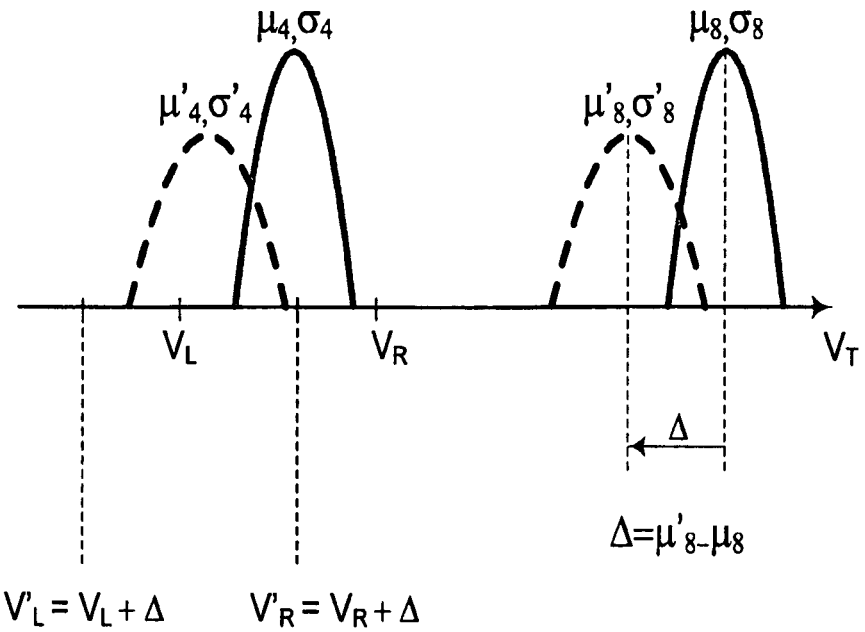
FIG. 22 is a graph of adaptive voltage intervals for estimation of means and standard deviations of intermediate program levels as shown and described herein.

FIG. 22 depicts this procedure for the case of estimating the mean and standard deviation of program level 4. For convenience, only the lobes of program levels four (4) and eight (8) are plotted. A default search voltage interval is defined, which corresponds to the case of a fresh device (see $V_L$, $V_R$ in FIG. 22). Then, after estimating the mean of the highest program level as described herein, the difference, denoted as Δ, is computed, between the estimated mean of the highest program level and the mean of the highest program level for a non-cycled and non-retained device. With this difference the endpoints of the search interval for program level 4 are shifted to a pair of new endpoints, namely $V'_L$, $V'_R$ as shown in FIG. 22, such that the new search interval coincides with the histogram mass of program level 4 as it behaves in the flash device. This ensures that within the voltage interval only a single maximum will be present, and it will be the one corresponding to the desired program level, e.g. as shown in FIG. 2B at steps 250 and 260, and in FIG. 10. The estimation procedure then continues in the same way as described herein.

Coarse Estimation of the Mean and standard deviation of the Intermediate Program Levels according to certain embodiments of the present invention, is now described in detail.

In some applications, fine estimation of the means and standard deviations of all the program levels with the procedure described hereinabove is prohibitively expensive in terms of the number of flash read operations employed to obtain the histograms. One way to alleviate the complexity is by using the fine estimation procedure only for a subset of the program levels.

In one embodiment, the means and standard deviations of program levels 2, 4, 6, and 8 are estimated finely as described hereinabove, and the remaining means and standard deviations are interpolated from the former. The means and standard deviations can be linearly interpolated by:

$$\mu_k = \frac{\mu_{k-1} + \mu_{k+1}}{2}, \quad k = 3, 5, 7$$

$$\sigma_k = \frac{\sigma_{k-1} + \sigma_{k+1}}{2}, \quad k = 3, 5, 7,$$

e.g. as shown in FIG. 2B at step 270 and in FIG. 11.

Methods for coping with certain types of non-Gaussian statistics according to certain embodiments of the present invention, are now described in detail.

In some situations, the Gaussian assumption regarding the probability distribution of the threshold voltage of the cells is not valid. In such cases, the formulae used to compute the decision thresholds is no longer close to optimal. It is known, as described e.g. in the above-referenced publication by Proakis, that the optimal reading thresholds should be placed precisely at the intersection point of the probability distributions corresponding to adjacent program levels. Alternatively, decision thresholds are computed, in which the intersection points are approximated by the voltage at which the histogram attains its minimal value. This can be achieved by defining new search intervals and obtaining the histogram as described hereinabove. The histogram can then be searched for the minimum, e.g. as shown in FIG. 2B at step 290 and in FIG. 13.

Methods for reducing the overhead of read operations from the flash device according to certain embodiments of the present invention, are now described in detail and are shown in FIG. 5 at step 510 and 520, and in FIGS. 7 and 8. As described hereinabove, read operations are done from the flash memory device in order to build the threshold voltage histogram of a population of cells within the device. In order to reduce the overhead associated with these read operations, read operations may be performed as follows. If it is desired estimate the mean and standard deviation of the highest program level, for which an appropriate voltage search interval $[V_L, V_R]$ is chosen. The process begins with the rightmost (largest) read voltage, and works its way towards the leftmost (smallest) read voltage. After the desired maximum is identified, continue reading a sufficient number of read voltages to complete $2*N_B+1$ histogram bins, and then terminate the reading process and continue with the processing of the sampled histogram in order to estimate the mean and standard deviation. This approach is beneficial especially in new devices where the threshold voltage distribution of the highest program level is close to the right edge of the voltage interval $[V_L, V_R]$.

Although the highest program level is used herein as an example for the possible benefit of this approach, this approach can be beneficial whenever read operations are used to estimate the means and standard deviations as described hereinabove.

Methods for ensuring uniform spreading of cells across program levels according to certain embodiments of the present invention, are now described in detail.

The accuracy of estimating the mean and standard deviation of the threshold distribution of a program level as described hereinabove depends on the number of cells which occupy this level. The more cells are programmed to a certain program level, the more accurate the mean and standard deviation estimation is. Since the data stored in the flash device is arbitrary, it may well be that the program levels of a particular page within a flash device are all the same, or that certain program levels are only scarcely occupied. This situation, unless changed, can cause inaccuracies in the estimation procedure, because the estimation might be based on too little cells. Such inaccuracies might be too high to the degree that the resulting reading thresholds will yield many detection errors and the error correcting code will fail. This situation may be circumvented by employing a scrambler on the data bits which are to be stored in the flash device and a descrambler on the bits which are read from the flash (unit 2200 of FIG. 27). For the purposes of the present specification, a scrambler may comprise any device which receives at its input a bit sequence and produces at its output another sequence of bits such that the following two conditions are met:
1. The 1s and 0s in the output bit sequence are equally likely.
2. The original bit sequence can be easily obtained from the output sequence by employing the inverse of the scrambling operation (descrambling).

When the bit sequence to be written to the flash is guaranteed to have 1s and 0s equally likely, the distribution of cells among the program levels is guaranteed to be more or less the same. In other words, the number of cells which will be programmed to each program level will be more or less the same. The phrase "more or less" is used to stipulate that the probability that the number of cells in any particular program level is too small to ensure sufficient accuracy of estimation is small enough so as not to degrade the overall performance, e.g. as shown in FIG. 2A at steps 202 and 320, and in FIG. 16.

Methods for preventing misidentification of local maximum corresponding to desired program level according to certain embodiments of the present invention, are now described in detail.

The procedure described hereinabove for finding the lobe corresponding to the estimated program level by searching for the first maximum from the right hinges on the assumption that the histogram H(m) does not exhibit any other local maxima to the right of the desired lobe. In situations where a local maximum does exist due to some fluctuating behavior in a small set of cells, this assumption does not hold. This situation might introduce a dramatic estimation error causing the reading threshold to be wrongly placed and the entire reading process to fail. In order to prevent misidentification of the lobe corresponding to the estimated program level, the search for the maximum may be modified as follows. Upon identifying a local maximum in the histogram, the number of cells which lie to the right of this maximum is tested (FIG. 8, step 850). If this number is above some threshold Th, this maximum is assumed to be the appropriate one. Otherwise, the search for the next maximum commences. Finally, it is noted that this procedure can also be employed in situations where the search for the local maximum is done from left to right.

Methods for maintaining a threshold history table to reduce the number of training procedures according to certain embodiments of the present invention, are now described in detail and are shown e.g. in FIG. 2A at step 220, in FIG. 2B at step 300 and in FIGS. 4 and 15.

The training procedures described hereinabove can be performed whenever it is difficult or impossible to determine reading thresholds which yield a sufficiently low bit error count, thus enabling the error correcting mechanism to recover the encoded data correctly. As mentioned above, performing these training procedures for each page in an erase sector might be prohibitively complex and/or might consume too much of the overall system's resources. For this reason, it is important to be able to determine appropriate reading thresholds without resorting to training.

Figure 23:
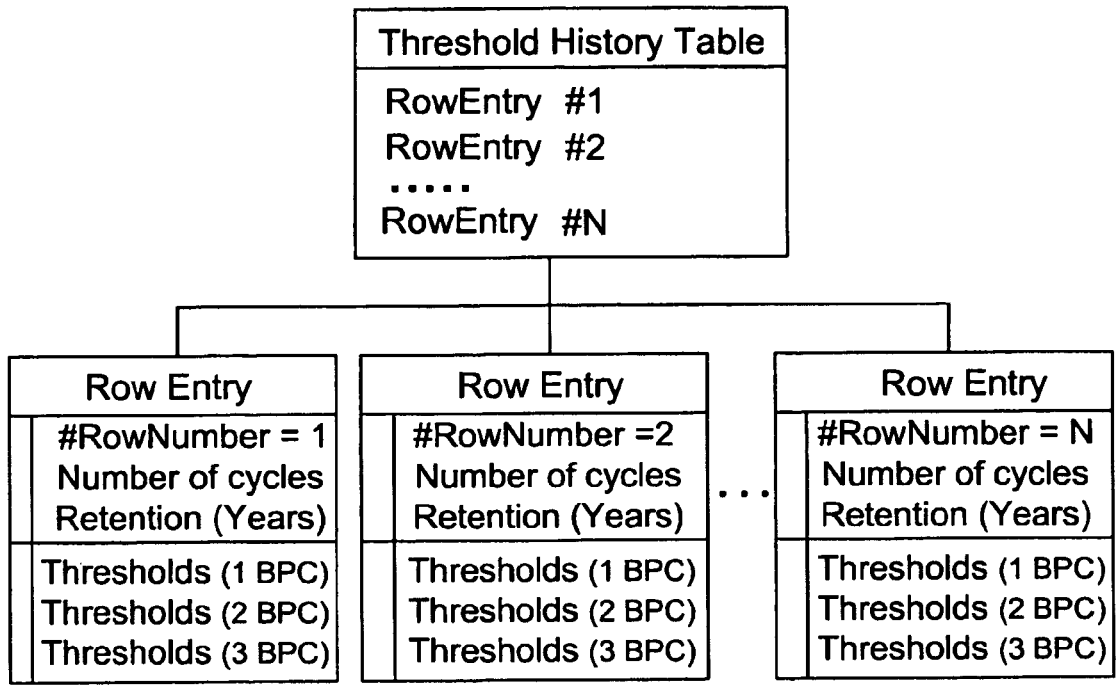
FIG. 23 is an example of a data structure for a Threshold history table which may be searched using the method of FIG. 4 and maintained using the method of FIG. 15.

In one embodiment of the present invention, reading thresholds of a certain page in a certain erase sector are stored in a data base and retrieved later on when reading successive pages of the same erase sector or other erase sectors. In one embodiment, a threshold history table (or data base) is structured as depicted in FIG. 23, in which BPC represents "bits per cell".

Each entry in the table comprises threshold information pertaining to a set of physical rows in the flash device. The set of rows associated with a particular row entry comprises of all the rows in the flash device sharing some common features, namely:

1. The row number within the erase sector.
2. The cycle count of the erase sector in which the row resides.
3. The retention period of the erase sector in which the row resides.

Figure 24:
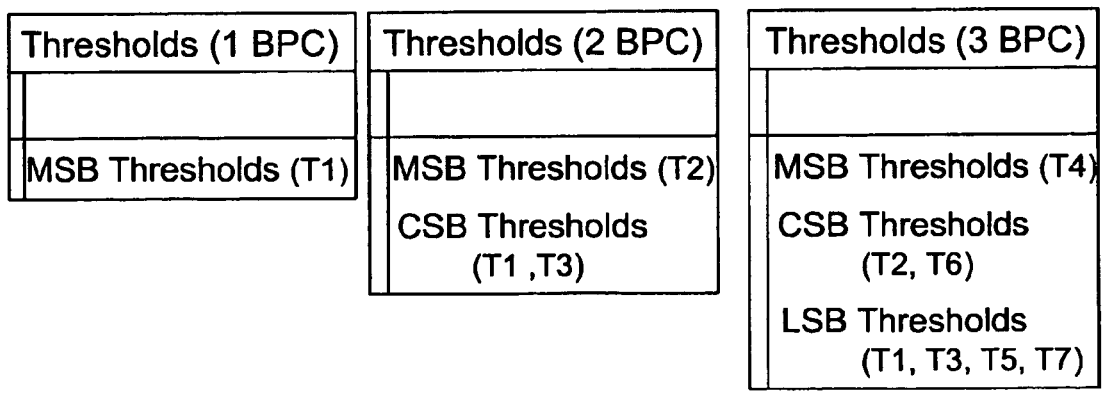
FIG. 24 is a simplified diagram of Detection thresholds sets useful in accordance with certain embodiments of the present invention.

It is assumed that a pair of rows having the same row index but residing in distinct erase sectors who share the same cycle count and retention period will behave the same in the sense that reading thresholds which are appropriate for the former row will also be appropriate for the latter. Each row entry includes reading thresholds which are organized in three data structures corresponding to the number of bits programmed to each cell in the row (BPC). A suitable structure of each set of thresholds is portrayed in FIG. 24.

The threshold set for the case where only the MSB bit is programmed includes only one MSB reading threshold. When two bits are programmed to each cell, a set of three thresholds is employed to read both the MSB and the CSB bit. Finally, seven thresholds are employed to read all the bits when MSB, CSB, and LSB bits are programmed. As reference, the thresholds marked in FIG. 19 correspond to the thresholds in the 3 BPC threshold structure of FIG. 24.

In one embodiment of the present invention, e.g. as shown in FIG. 2B at step 300 and in FIG. 15, each time a training procedure is performed on a physical row, the obtained thresholds are stored in an appropriate data structure of an appropriate row entry. A suitable method for updating the threshold history table in this case is shown in FIG. 15. At first, the data base is searched for an entry which matches the row number, cycle count and retention period. If no such entry is found, one is created. Then, the corresponding threshold structure is updated with the thresholds from the training procedure.

Figure 25:
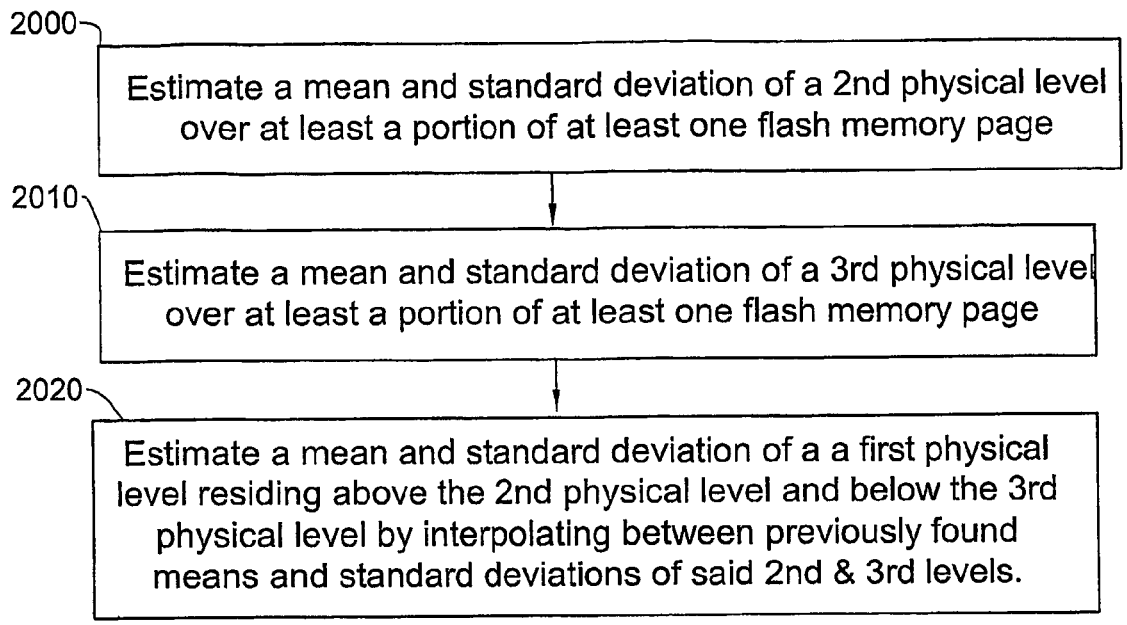
FIG. 25 is a simplified flowchart illustration of a method for rapidly assessing functionality of erase sectors in a flash memory operative in accordance with certain embodiments of the present invention.

In one embodiment of the present invention, e.g. as shown in FIG. 2A at step 202 and in FIG. 16, the threshold history table is used as follows. When a page is to be read from the flash device, the controller checks if an entry exists which corresponds to the row number where the page resides, the cycle count of the erase sector where the page resides, and the retention period thereof. If such an entry exists, the controller checks if thresholds exist for the appropriate value of BPC of the row in which the page resides. If such thresholds exist, the controller uses these thresholds to read the desired page. If no entry is found in the table, and/or if no thresholds are found which match the value of BPC, the controller proceeds to perform training for the row in which the page resides. FIG. 25 is a simplified flowchart illustration of a method for rapidly assessing functionality of erase sectors in a flash memory operative in accordance with certain embodiments of the present invention. The method of FIG. 25 typically includes the following steps, suitably ordered e.g. as shown:

Step 2000: Estimate a mean and standard deviation of a 2nd physical level over at least a portion of at least one flash memory page Step 2010: Estimate a mean and standard deviation of a 3rd physical level over at least a portion of at least one flash memory page Step 2020: Estimate a mean and standard deviation of a first physical level residing above the 2nd physical level and below the 3rd physical level by interpolating between previously found means and standard deviations of the 2nd and 3rd levels.

Figure 26:
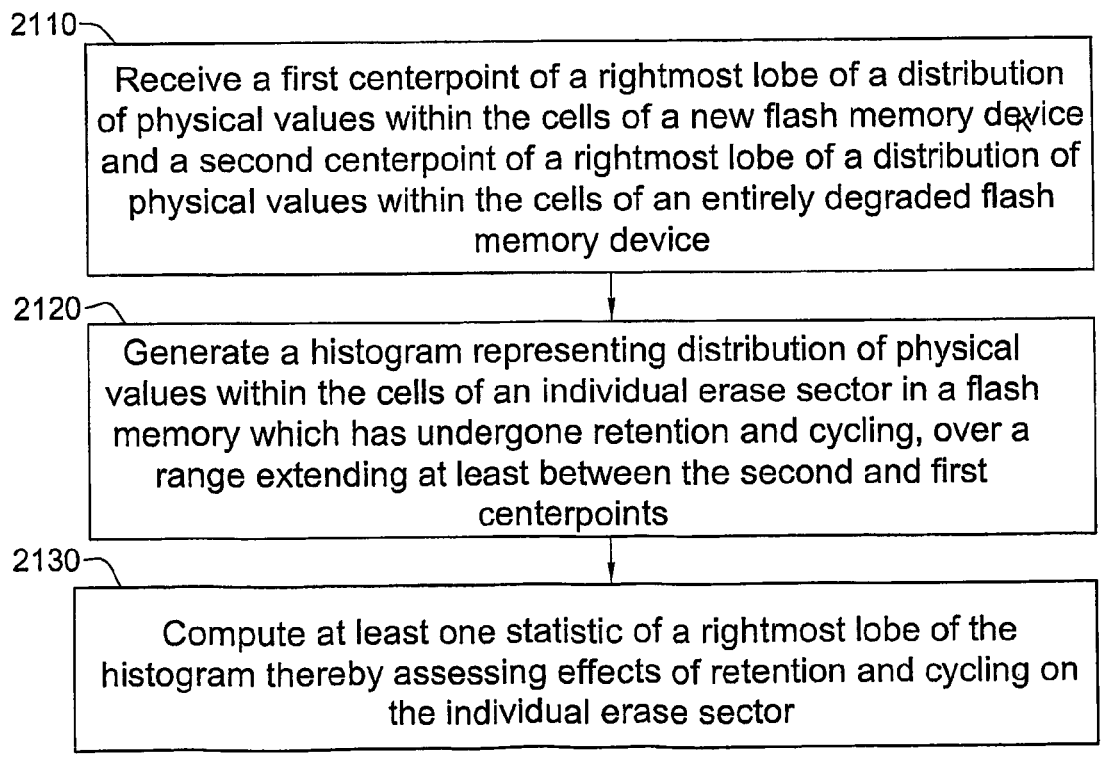
FIG. 26 is a simplified flowchart illustration of a method for assessing effects of retention and cycling on individual erase sectors in a flash memory which has undergone retention and cycling, operative in accordance with certain embodiments of the present invention.

FIG. 26 is a simplified flowchart illustration of a method for assessing effects of retention and cycling on individual erase sectors in a flash memory which has undergone retention and cycling, operative in accordance with certain embodiments of the present invention. The method of FIG. 26 typically includes the following steps, suitably ordered e.g. as shown:

Step 2110: receive a first centerpoint of a rightmost lobe of a distribution of physical values within the cells of a new flash memory device and a second centerpoint of a rightmost lobe of a distribution of physical values within the cells of an entirely degraded flash memory device Step 2120: generate a histogram representing distribution of physical values within the cells of an individual erase sector in a flash memory which has undergone retention and cycling, over a range extending at least between the second and first centerpoints Step 2130: compute at least one statistic of a rightmost lobe of the histogram thereby assessing effects of retention and cycling on the individual erase sector.

FIG. 27 is a simplified functional block diagram of the external controller 102 of FIG. 1B, according to certain embodiments of the present invention. Alternatively, some or all of the functionalities shown may be implemented in the internal controller 110 of FIG. 1B. As shown, the controller includes a scrambler/descrambler 2200 which typically employs a linear feedback shift register 2210 such as that illustrated in FIG. 18. The scrambler/descrambler 2200 receives and scrambles data from the host 100 of FIG. 1B for writing to the flash memory 105 as well as, conversely, receiving and de-scrambling data read from the flash memory 105 which is intended for the host 100. A histogram processing unit 2230 may be operative to perform at least some of steps 240, 260, 270 and 290 of FIG. 2B, providing output to a final reading threshold computation unit 2240 which computes actual (as opposed to mock) reading thresholds, e.g. performing at least some of steps 280 and 290 of FIG. 2B, and stores suitable information in a threshold history database 2250 such as that of FIG. 23. A mock reading threshold computation unit 2260 receives output from the histogram processing unit 2230. Unit 2230 is operative based on output of mock reading operations in the flash, carried out using mock reading thresholds generated by unit 2260. Mock reading threshold computation unit 2260 typically performs some or all of steps 240, 250 and 260 of FIG. 2B. A conventional control unit 2270, which may have some or all of the functionalities of conventional external flash memory device controllers, is connected to all units.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/ CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above. The present invention may for example interface with or modify, as per any of the embodiments described herein, one, some or all of the above components.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

What is claimed is:

1. A method for reading at least one page within an erase sector of a flash memory device, the method comprising: computing at least one mock reading threshold; wherein the mock threshold that is far from an adequate conventional reading threshold useful for reconstructing a logical value from a physical value residing in a flash memory cell; using said at least one mock reading threshold to perform at least one mock read operation of at least a portion of at least one page within said erase sector, thereby to generate a plurality of logical values; defining a set of reading thresholds based at least partly on said plurality of logical values; and reading at least one page in said erase sector using said set of reading thresholds.

2. A method according to claim 1 wherein said defining of a set of reading thresholds based at least partly on said plurality of logical values includes estimating a mean and standard deviation of at least one physical level over at least a portion of at least one page belonging to the erase sector of the flash memory device based on said at least one mock reading operation.

3. A method according to claim 2 wherein said estimating is performed for at least a first physical level residing above a second physical level and below a third physical level and wherein estimating the mean and standard deviations of said first physical level comprises interpolating between previously found means and standard deviations of said second and third levels.

4. A method for rapidly assessing functionality of erase sectors in a flash memory, the method comprising: estimating a mean and standard deviation of at least one physical level over at least a portion of at least one page belonging to an erase sector of a flash memory device; wherein said estimating is performed for at least a first physical level residing above a second physical level and below a third physical level and wherein estimating the mean and standard deviations of said first physical level comprises interpolating between previously found means and standard deviations of said second and third levels.

5. A method according to claim 1 wherein said defining of a set of reading thresholds based at least partly on said plurality of logical values includes identifying at least one non-populous region of a predetermined size, within a distribution of physical values of a population of cells belonging to a page within the erase sector.

6. A method according to claim 5 wherein at least one reading threshold in said set of reading thresholds is determined to be a central value within said non-populous region.

7. A method for assessing effects of retention and cycling on individual erase sectors in a flash memory which has undergone retention and cycling, the method comprising: receiving a first centerpoint of a rightmost lobe of a distribution of physical values within the cells of a new flash memory device and a second centerpoint of a rightmost lobe of a distribution of physical values within the cells of an entirely degraded flash memory device; generating a histogram representing distribution of physical values within the cells of an individual erase sector, over a range extending at least between said second and first centerpoints; and computing at least one statistic of a rightmost lobe of the histogram.

8. A method according to claim 7 wherein said at least one statistic comprises at least one of a mean and a standard deviation.

9. A method according to claim 1 wherein said defining comprises seeking a local maximum in a threshold voltage distribution and determining at least one reading threshold based at least partly on said local maximum.

10. A method according to claim 1 wherein said defining comprises seeking a local minimum in a threshold voltage distribution and determining at least one reading threshold based at least partly on said local minimum.

11. A method according to claim 1 wherein said defining comprises: identification of a threshold voltage distribution of a highest program level in a probability distribution of physical values within said erase sector; and preventing misidentification of the threshold voltage distribution of the highest program level by comparing the number of cells whose threshold voltage is larger than the candidate maximizing voltage, to a threshold.

12. A method according to claim 1 and also comprising guaranteeing a similar number of cells in each program level.

13. A method according to claim 1 wherein, each time said computing, using, defining and reading are performed, said reading thresholds as most recently modified are stored in a data base in association with characterization information, said method also comprising, for at least one page in said erase sector: accessing said data base and reviewing at least some of said characterization information to determine whether said database includes reading thresholds suitable for said page; if said database does include suitable thresholds, using said suitable thresholds to read said page; and if said database does not include suitable thresholds, performing said computing, using, defining and reading steps for said page.

14. A method according to claim 13 wherein said characterization information includes:

identification of row neighborhood, number of program/erase cycles which rows in said row neighborhood underwent, and retention period which rows in said row neighborhood endured.

15. A method according to claim 12 wherein said guaranteeing comprises scrambling of bits stored in said erase sector.

16. A system for reading at least one page within an erase sector of a flash memory device, the system comprising: mock threshold computation apparatus operative to compute at least one mock reading threshold; wherein the mock threshold that is far from an adequate conventional reading threshold useful for reconstructing a logical value from a physical value residing in a flash memory cell; a reading threshold set generator operative to define a set of reading thresholds based at least partly on said plurality of logical values; and reading apparatus using said at least one mock reading threshold to perform at least one mock read operation of at least a portion of at least one page within said erase sector, thereby to generate a plurality of logical values and subsequently using said set of reading thresholds based at least partly on said plurality of logical values to read at least one page in said erase sector using said set of reading thresholds.

17. A system for rapidly assessing functionality of erase sectors in a flash memory, the system comprising: flash memory physical level distribution statistic estimation apparatus estimating a mean and standard deviation of at least one physical level over at least a portion of at least one page belonging to an erase sector of a flash memory device and including interpolation apparatus, wherein said apparatus receives and operates upon at least a first physical level residing above a second physical level and below a third physical level by using said interpolation apparatus to interpolate between previously found means and standard deviations of said second and third levels.

18. A system for assessing effects of retention and cycling on individual erase sectors in a flash memory which has undergone retention and cycling, the system comprising: a histogram generator operative to generate a histogram representing distribution of physical values within the cells of an individual erase sector, over a range extending at least between a first centerpoint of a rightmost lobe of a distribution of physical values within the cells of a new flash memory device and a second centerpoint of a rightmost lobe of a distribution of physical values within the cells of an entirely degraded flash memory device; and a rightmost lobe analyzer operative to compute at least one statistic of a rightmost lobe of the histogram.

19. A method according to claim 1 wherein said computing comprises translating the mock reading thresholds along a physical value axis of a probability distribution of physical values within said erase sector, according to at least one characteristic of a highest program level within said probability distribution.

\* \* \* \* \*